US011082056B2

(12) United States Patent
Bodnar et al.

(10) Patent No.: US 11,082,056 B2
(45) Date of Patent: Aug. 3, 2021

(54) ANALOG TO DIGITAL CONVERTER STAGE

(71) Applicant: Analog Devices International Unlimited Company, Limerick (IE)

(72) Inventors: Rares Bodnar, Reading (GB); Asif Ahmad, Newbury (GB); Christopher Peter Hurrell, Cookham (GB)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 0 days.

(21) Appl. No.: 16/692,371

(22) Filed: Nov. 22, 2019

(65) Prior Publication Data
US 2020/0162095 A1 May 21, 2020

Related U.S. Application Data

(63) Continuation of application No. 15/916,009, filed on Mar. 8, 2018, now Pat. No. 10,516,408.

(51) Int. Cl.
| | | |
|---|---|---|
| *H03M 1/66* | (2006.01) | |
| *H03M 1/14* | (2006.01) | |
| *H03M 1/12* | (2006.01) | |
| *H03M 1/80* | (2006.01) | |
| *H03M 1/46* | (2006.01) | |

(Continued)

(52) U.S. Cl.
CPC .......... *H03M 1/145* (2013.01); *H03M 1/124* (2013.01); *H03M 1/802* (2013.01); *H03M 1/0845* (2013.01); *H03M 1/0863* (2013.01); *H03M 1/42* (2013.01); *H03M 1/466* (2013.01); *H03M 1/468* (2013.01); *H03M 1/804* (2013.01)

(58) Field of Classification Search
CPC .... H03M 1/145; H03M 1/802; H03M 1/1241; H03M 1/466; H03M 1/14; H03M 1/80; H03M 1/12; H03M 1/46
USPC .................................................. 341/144, 145
See application file for complete search history.

(56) References Cited

U.S. PATENT DOCUMENTS 5,619,203 A * 4/1997 Gross, Jr. ............... H03M 1/765
341/144
5,717,396 A * 2/1998 Gross, Jr. ............... H03M 1/145
341/156

(Continued)

FOREIGN PATENT DOCUMENTS

| JP | 2001-203577 | 7/2001 |
|---|---|---|
| JP | 2003-264464 | 9/2003 |

(Continued)

OTHER PUBLICATIONS

U.S. Appl. No. 15/916,009, filed Mar. 8, 2018, Analog to Digital Converter Stage.

(Continued)

*Primary Examiner* — Jean B Jeanglaude
(74) *Attorney, Agent, or Firm* — Patent Capital Group

(57) ABSTRACT

A stage, suitable for use in an analog to digital converter or a digital to analog converter, can have a plurality of slices that can be operated together to form a composite output. The stage can have reduced thermal noise, while each slice on its own has sufficiently small capacitance to respond quickly to changes in digital codes applied to the slice. This feature allows a fast conversion to be achieved without loss of noise performance.

23 Claims, 17 Drawing Sheets

(51) Int. Cl.
*H03M 1/08* (2006.01)
*H03M 1/42* (2006.01)

(56) References Cited

U.S. PATENT DOCUMENTS

| | | | | |
|---|---|---|---|---|
| 5,731,775 | A | * | 3/1998 | Gross, Jr. ............... H03M 1/147 341/155 |
| 6,404,364 | B1 | | 6/2002 | Fetterman et al. |
| 6,570,521 | B1 | | 5/2003 | Schofield |
| 7,123,178 | B2 | | 10/2006 | Ishizuka et al. |
| 7,453,388 | B1 | * | 11/2008 | Gutnik ................. H04B 10/695 341/155 |
| 7,602,324 | B1 | | 10/2009 | Huang et al. |
| 7,663,518 | B2 | | 2/2010 | Hurrell |
| 7,688,237 | B2 | * | 3/2010 | Cao ..................... H03M 1/1061 341/120 |
| 9,331,709 | B2 | | 5/2016 | Steensgaard-Madsen |
| 9,545,623 | B2 | | 1/2017 | Breuil et al. |
| 9,608,655 | B1 | | 3/2017 | Li et al. |
| 9,793,908 | B2 | * | 10/2017 | Shibata ................. H03M 3/458 |
| 10,505,561 | B2 | | 12/2019 | Bodnar et al. |
| 10,511,316 | B2 | | 12/2019 | Bodnar et al. |
| 10,516,408 | B2 | | 12/2019 | Bodnar et al. |
| 2006/0022854 | A1 | | 2/2006 | Bjornsen |
| 2006/0114144 | A1 | | 6/2006 | Lyden et al. |
| 2007/0109168 | A1 | | 5/2007 | Hennessy et al. |
| 2008/0150772 | A1 | * | 6/2008 | Cao ..................... H03M 1/1061 341/120 |
| 2013/0120174 | A1 | | 5/2013 | Ali |
| 2015/0280730 | A1 | | 10/2015 | Tanaka et al. |
| 2016/0149587 | A1 | | 5/2016 | Mulder |
| 2017/0077937 | A1 | | 3/2017 | Shu |
| 2019/0280704 | A1 | | 9/2019 | Bodnar et al. |
| 2019/0280705 | A1 | | 9/2019 | Bodnar et al. |
| 2019/0280706 | A1 | | 9/2019 | Bodnar et al. |

FOREIGN PATENT DOCUMENTS

| | | |
|---|---|---|
| JP | 2006-019988 | 1/2006 |
| JP | 2009-516433 | 4/2009 |
| JP | 2013-074401 | 4/2013 |
| JP | 2013-211611 | 10/2013 |
| JP | 2014-533469 | 12/2014 |
| JP | 2015-186137 | 10/2015 |
| JP | 2017-060159 | 3/2017 |
| WO | 2002-023728 | 3/2002 |
| WO | 2019-170862 | 9/2019 |

OTHER PUBLICATIONS

JP Office Action (OA1) dated Jun. 29, 2020 in JP2019-041419, 6 pages.
English Translation of Foreign Reference JP-201311611, 18 pages.
English Translation of Foreign Reference JP-2003-264464, 1 page (Abstract only).
JP Office Action (OA1) dated Mar. 9, 2020 in JP2019-042546, 4 pages.
Notice of Allowance issued in U.S. Appl. No. 16/053,455 dated Aug. 2, 2019, 9 pages.
EP Office Action issued in EP Patent Application Serial No. 19161686.1 dated Aug. 13, 2019, 10 pages.
Ex Parte Quayle Office Action issued in U.S. Appl. No. 16/052,890 dated Oct. 22, 2018, 9 pages.
Notice of Allowance issued in U.S. Appl. No. 16/052,890 dated Dec. 5, 2018, 7 pages.
Non-Final Office Action issued in U.S. Appl. No. 16/052,890 dated Mar. 25, 2019, 7 pages.
Notice of Allowance issued in U.S. Appl. No. 16/052,890 dated Aug. 19, 2019, 7 pages.
Office Action issued in EP Patent Application Serial No. 19161602.8 dated Aug. 13, 2019, 12 pages.
Verbruggen et al., *A 2.5 mW 11b 410 MS/s Dynamic Pipelined SAR ADC with Background Calibration in 28nm Digital CMOS*, 2013 Symposium on VLSI Circuits Digest of Technical Papers, 2 pages.
Ke et al., *A 14-bit 100 MS/s SHA-less pipelined ADC with 89 dB SFDR and 74.5 dB SNR*, IEICE Electronics Express, vol. 12, No. 5, © 2015, 11 pages.
JP Notice of Allowance dated Sep. 25, 2020 in JP2019-041419, 4 pages.
EN Abstract (only) to JP2013-074401, 1 page.

* cited by examiner

ANALOG TO DIGITAL CONVERTER STAGE

RELATED APPLICATIONS

The present disclosure is a continuation of U.S. non-provisional application Ser. No. 15/916,009 entitled "ANALOG TO DIGITAL CONVERTER STAGE" and filed Mar. 8, 2018, the disclosure of which is incorporated herein by reference in its entirety.

TECHNICAL FIELD OF THE DISCLOSURE

The present disclosure relates to techniques and structures for providing an improved analog to digital converter, and specifically to improving speed and resolution without sacrificing noise performance.

BACKGROUND

Analog to digital converters are judged on parameters such as sampling rate, noise, linearity, power consumption and resolution.

Each of these parameters can affect the choice of analog to digital converter (ADC) technology that is chosen for a task. For example "Flash converters" offer high throughput rates, but since each possible output result is evaluated by a respective comparator, then the comparator input referred offset limits the minimum bit size that can be resolved. Furthermore providing large numbers of comparators can be relatively power hungry.

Where noise performance is prioritized, then the noise shaping properties of sigma-delta ($\Sigma\Delta$) converters may make them attractive. The $\Sigma\Delta$ converter uses a low resolution quantizer, often only 1 or 2 bits, to significantly oversample an input signal. This gives good linearity. Such circuits also provide the possibility to make the noise transfer function different from the signal transfer function. This gives the designer an option to move quantization noise away from the bandwidth of the signal. The conversion rates tends to lower than other ADC technologies.

Successive approximation register (SAR) analog to digital converters can be used to provide good resolution, good power consumption and reasonable noise performance at reasonable sampling rates. However there is a continuing need to improve ADC performance.

BRIEF DESCRIPTION OF THE DRAWINGS

To provide a more complete understanding of the present disclosure and features and advantages thereof, reference is made to the following description, taken in conjunction with the accompanying Figures, wherein like reference numerals represent like parts, in which.

DETAILED DESCRIPTION

Overview

Figure 1:
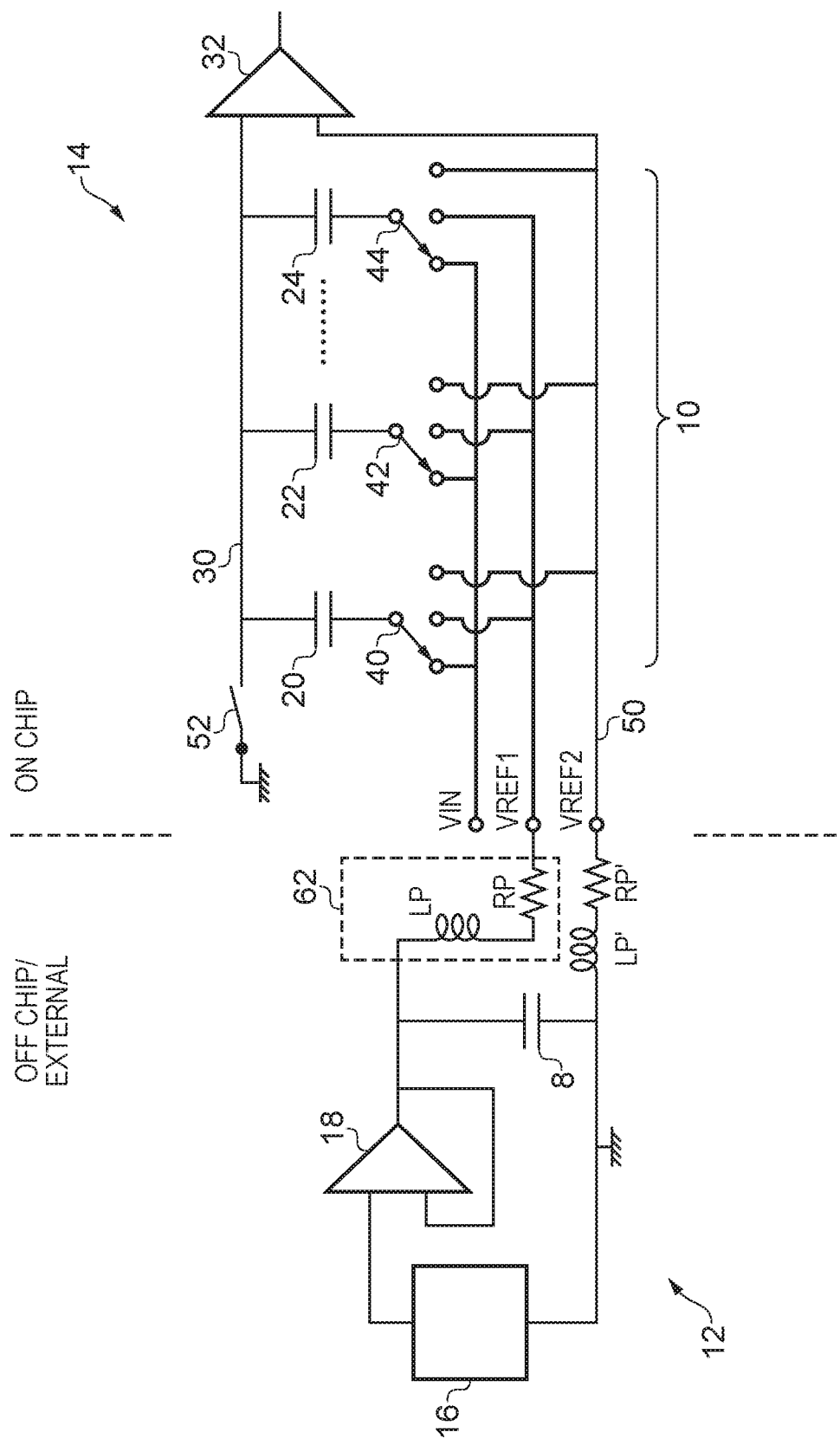
FIG. 1 is a schematic illustration of a switched capacitor sampling digital to analog converter (DAC) in conjunction with the reference voltage generator that supplies it, so as to illustrate the parasitic components in the reference voltage path that introduce ringing and hence the need to allow a settling time during bit trials.

A stage, suitable for use in an ADC or a DAC where the stage comprises a plurality of slices that can be operated together to form a composite output, can have reduced thermal noise, whilst each slice on its own has sufficiently small capacitance to respond quickly to changes in digital codes applied to the slice. This allows a fast conversion to be achieved without loss of noise performance.

According to a first aspect of the present disclosure there is provided a stage of an analog to digital converter, the stage comprising: an analog to digital converter coupled to a first acquisition circuit having a first time constant, and a plurality of circuits, each comprising an acquisition circuit having substantially the same time constant as the first time constant and a digital to analog converter for receiving a respective control signal based on a digital output of the analog to digital converter and for forming a difference between the sampled voltage held by the respective acquisition circuit and the digital to analog converter output.

Preferably the first acquisition circuit and the acquisition circuits of the plurality of circuits are formed of structurally similar "sampling slices". A sampling slice may comprise at least one capacitor with an associated switch, where the physical sizes of the components within a slice on a semiconductor wafer are the same between slices or where the slices scale with respect to one another. In one example if a capacitor (a given capacitor) in a first slice has an area Q times bigger than the corresponding capacitor in a second slice, then a transistor associated with connecting one of the plates of the given capacitor in the first slice to a signal node to which a signal to be sampled is applied, has a width to length ratio Q times bigger than the corresponding transistor in the second slice. In this example it has been assumed that the inter-plate dielectric thickness for the capacitors is the same and the transistors are nominally identically doped. Thus the signal acquisition and sampling performance between the first acquisition circuit and the acquisition circuits of the plurality of circuits are matched.

The acquisition circuits can be provided as sample and hold or track and hold circuits. Each acquisition circuit can be implemented within a respective "sampling slice" of the stage.

It is thus possible to use one slice to form a digital representation of an analog input value and use the other slices to work together to form an analog residue with reduced sampling thermal noise compared to that of a single slice. The analog residue represents a quantization error of the analog to digital converter, being the difference between the sampled analog value and analog equivalent of the digital value being output from the analog to digital converter stage. The slices may advantageously be produced so as to be identical (within manufacturing tolerance), e.g. the same size and shape and using shared fabrication steps. This gives rise to excellent matching between the slices.

According to a second aspect of the present disclosure there is provided an analog to digital converter using a plurality of slices having substantially matched time constants operable together to form a residue having reduced thermal noise compared to the thermal noise of a single slice. In such an arrangement one slice may be used to perform an analog to digital conversion in response to signals from an appropriately configured controller and the remaining slices may be used as slaves to form the residue.

According to a third aspect of the present disclosure there is provided a sliced DAC comprising a plurality of substantially identical switched capacitor sampling DACs adapted to be connected in parallel to form a composite sampling DAC output having reduced sampling thermal noise compared to the thermal noise of any single slice.

Preferably the sampling DAC stages are set in response to an analog to digital converter output, and the sampling DAC stages do not participate in the analog to digital conversion, for example they do not participate is bit trials of a successive approximation converter belonging to the same stage as the sampling DAC. The sampling DAC stages may be set bit by bit, or bits may be set in groups so as to reduce transient current flows.

According to a fourth aspect of the present disclosure there is provided a method of operating a plurality of matched sampling DAC slices to form an ADC result and a residue, the method comprising operating one of the slices to perform an analog to digital conversion and operating at least two of the slices to perform a digital to analog conversion to form a difference between the sampled input and a digital approximation of the sampled input.

According to a further aspect of the present disclosure there is provided a plurality of sampling DAC slices, where for a first capacitor if the area of a capacitor plate divided by the plate separation distance in a first slice differs from that of a corresponding capacitor in a second slice by a first ratio, then the width to length ratio of a transistor switch associated with the first capacitor in the first slice differs from that of the corresponding transistor in the second slice by substantially the first ratio.

The sampling DAC slices may have substantially the same physical footprint on a substrate. The substrate may be a semiconductor upon which the capacitors and switches of the slices have been formed by known fabrication techniques.

According to a further aspect of the present disclosure there is provided a plurality of sampling DAC slices, where the sampling DAC slices comprise a plurality of unit cells, each comprising a respective unit size capacitor and associated unit size transistor switches, and where pluralities of the unit cells are grouped together to form weighted capacitors within the sampling DAC slices, and where the sampling DAC slices are connected to a shared input node to sample an input signal in unison, and are connectable to a shared output node to form an average of their respective residues.

Design Challenges for Analog to Digital Converters

Analog to digital converters are widely used, for example in telecommunications equipment, cameras, audio equipment, games consoles, industrial systems, medical devices, automotive applications, aerospace applications, and a whole host of other applications and systems where an analog value, which may represent light intensity, sound, pressure, speed, voltage, current, a radio signal and so on, is converted into a digital quantity that can be processed by a data processor, an embedded digital circuit, a computer or so on.

The speed at which conversions are required, and the number of bits of resolution required, can vary enormously.

As noted above, there is a desire to provide ADCs with high conversion throughput, for example operating with signal bandwidths of between 10 and 100 MHz, at good resolution, say greater than 14 bits. The present disclosure provides structures for achieving these kind of superior performance levels. However achieving this performance is difficult, and to appreciate how difficult and hence understand the nature of the inventive aspects of this disclosure, it is useful to provide a summary of the structure of popular converter architectures before looking at some of the fundamental limitations around the physics relating to sampling circuits and digital to analog converters.

A particularly popular variant of ADC uses a switched capacitor array to act both as a sample and hold circuit and as a capacitive DAC which is driven to test a bit trial value against the sampled analog signal value. Often analog to digital converters are provided as differential circuits. While the present disclosure considers single ended converters (as they are simpler), the comments and considerations being discussed herein apply equally to differential analog to digital converters.

FIG. 1 schematically shows a prior art arrangement comprising a sampling switched capacitor digital to analog converter, generally indicated 10 which is provided within an integrated circuit implementing an analog to digital converter 14 and which receives a first reference voltage Vref1 from an external reference circuit, generally designated 12. In this context "external" means that the reference circuit (or at least not all of it) is not provided on the same silicon die as the switched capacitor charge redistribution digital to analog converter 10. However all of or some parts of the reference circuit may be co-packaged with the die carrying the analog to digital converter 14 such that from a user's perspective all the components are provided by the same chip scale package or integrated circuit. The reference circuit comprises a precision voltage reference 16 which is often (but not necessarily) buffered by a buffer 18. The output voltage at the output of the buffer 18 can be further stabilized by the provision of a relatively large storage capacitor 8 external to or co-packaged with the integrated circuit die inside a chip scale package, even though other parts of the circuit such as a buffer or voltage reference source might be provided on the silicon die with the ADC. The DAC 10 also receives Vref2, which may be a local 0V, ground or Vss to which all other voltages are referenced.

Although charge redistribution digital to analog converters as part of successive approximation analog to digital converters are well known, for completeness a brief description of their operation will be presented here. The charge redistribution digital to analog converter comprises a plurality of capacitors, of which in this example three capacitors 20, 22 and 24 are shown. Other capacitors may exist between capacitors 22 and 24. In a converter that does not have redundancy, the capacitors are binary weighted and follow a binary progression. Thus, if only three capacitors existed and capacitor 24 had a notional and arbitrary value of "1C" then the capacitor 22 would have a value of "2C" and a capacitor 20 would have a value of "4 C". Each capacitor can be regarded as representing a bit in a binary word, and hence the largest capacitor, in this example, capacitor 20, represents the most significant bit, MSB, having a weight of 4C, whereas the smallest capacitor 24 represents the least significant bit, LSB, having a weight of 1C. Such capacitor arrays as used in analog to digital converters commonly provide between 12 and 16 bits of resolution and this implies a corresponding number of capacitors. It is also known that to avoid scaling problems between the MSB and the LSB, the capacitor array can be divided or segmented one or more times. This effectively allows a rescaling between capacitors in each segment of the array and avoids the need for the largest capacitor of the DAC to be, for example $2^{15}$ times the size of the smallest capacitor for a 16 bit converter. Although not shown, the switched capacitor array or a segment thereof is typically terminated by an additional terminating capacitor having a value equal to the least significant capacitor within that array. For completeness a divided array will be discussed later with respect to FIG. 2.

Continuing with FIG. 1, it is also known to vary the 'weights' (that is the relative capacitance of the capacitors) or numbers of capacitors within the array in order to provide some redundancy, i.e., the ability to recover from an incorrect bit decision during the conversion process. This can allow the designer to reduce the settling time between each bit trial to achieve a faster conversion rate. Redundancy can, for example, be achieved by occasionally inserting at least one additional capacitor within the array which repeats a weight, thus the capacitors are still binary weighted but do not follow a binary sequence of weights. A further approach to providing redundancy is to change the "radix" of the capacitors in the array from 2 (which represents binary weighting) to a smaller number such as 1.8. Thus the ratio of one capacitor to its neighbor becomes 1.8 rather than 2. This inserts redundancy into the array such that an incorrect bit decision can be corrected as the conversion process proceeds. In either case, redundancy is implemented so as to allow errors of either sign (i.e., the error has made the result underweight or overweight) to be corrected as the conversion proceeds, as is known to the person skilled in the art.

As shown in FIG. 1 each of the capacitors 20, 22, 24 has a first plate, which will also be referred to as a top plate which is connected to a conductor 30 which itself is connected to a first input of a comparator 32. Each capacitor also has a second plate, also referred to as a bottom plate, which is connected to an electronic switch. The first capacitor 20 is connected to a first switch 40, the second capacitor 22 is connected to a second switch 42 and the third capacitor 24 is connected to a third switch 44. The switches are schematically shown as three position switches although in reality they may be implemented as three field effect transistors per switch which are controlled by a switch controller (not shown). The switch 40 can be regarded as being operable in a first position or first mode to connect the bottom plate of the capacitor 20 to a signal input Vin. In a second position or second mode it is operable to connect the bottom plate of the capacitor 20 to Vref1, and in a third position or third mode it connects the bottom plate of the capacitor 20 to a second input Vref2, which often corresponds to a local ground or a "negative" power rail. The second and third switches 42 and 44 are similarly configured, and the second input of the comparator is, in this example, also connected to the local ground via a conductor 50. As noted before, only three capacitors and their associated switches have been illustrated for simplicity, but more switches can be provided within an ADC.

In a sample or track phase of operation of the analog to digital converter described in this example, the switches 40, 42 and 44 are connected to Vin whilst a further switch 52 is closed so as to connect the conductor 30, and hence the top plates of the capacitors, to ground or some other appropriate reference or bias voltage. This enables the capacitors 20, 22 and 24 to become charged with the voltage Vin. The analog to digital converter then moves to a convert phase in which switch 52 is opened so as to allow the voltage on the conductor 30 to float, and the switches 40, 42 and 44 are initially connected to Vref2. The bit trial sequence can then begin. Initially the first bit, i.e., the most significant bit is trialed by connecting the bottom plate of the capacitor 20 to Vref1. This causes charge redistribution between the capacitors to occur as they form a potential divider. As a result the voltage at a first input to the comparator changes and after a settling time has elapsed, the comparator is strobed (i.e., its output is examined) in order to determine whether the voltage at the first input is greater or less than the voltage at the second input. If the voltage of Vin was sufficiently great such that it exceeds the value equivalent to $$\frac{Vref1}{2},$$

then the voltage at the first input of the comparator exceeds that at the second input of the comparator and the most significant bit is kept and capacitor 20 remains connected to Vref1, otherwise the bit is discarded and switch 40 is operated to connect the bottom plate of the MSB capacitor 20 back to Vref2. The process proceeds to the next bit trial, i.e., to test the second bit where the lower plate of capacitor 22 is connected to Vref1 (the state of switch 40 remaining unchanged from whichever position it was left in after the end of the first bit trial) after a settling time the output of the comparator 32 is examined to see whether the switch 42 should be left as it is, or reset back to connecting the lower plate of the capacitor 22 to Vref2. Switch 42 is then either reset or left alone as a result of that comparison, and the trial moves on to the next capacitor 24 and switch 44 is changed from Vref2 to Vref1. Again after a settling time the output of the comparator is examined to see whether switch 44 should be left in its current position or reset. At the end of the trial sequence the positions of the switches 40, 42 and 44 can be examined and these represent the converted result. The sequence can be extended to include more than three capacitors. Similarly the sequence can be extended to include switched capacitor arrays having redundancy, whether this is by the inclusion of additional redundant capacitors or by using a radix less than 2, but then the switch sequence needs to be examined and further converted into a binary word. Although the ADC has been described as a single ended device, the above description can be extended to differential converters. Furthermore the terminology "bit trial" stems from the early days of SAR converters where only one bit could be determined during each bit trial. More modern designs enable multiple bits to be determined during a bit trial, and the term "bit trial" as used herein includes determining more than one bit in a given bit trial period.

Figure 2:
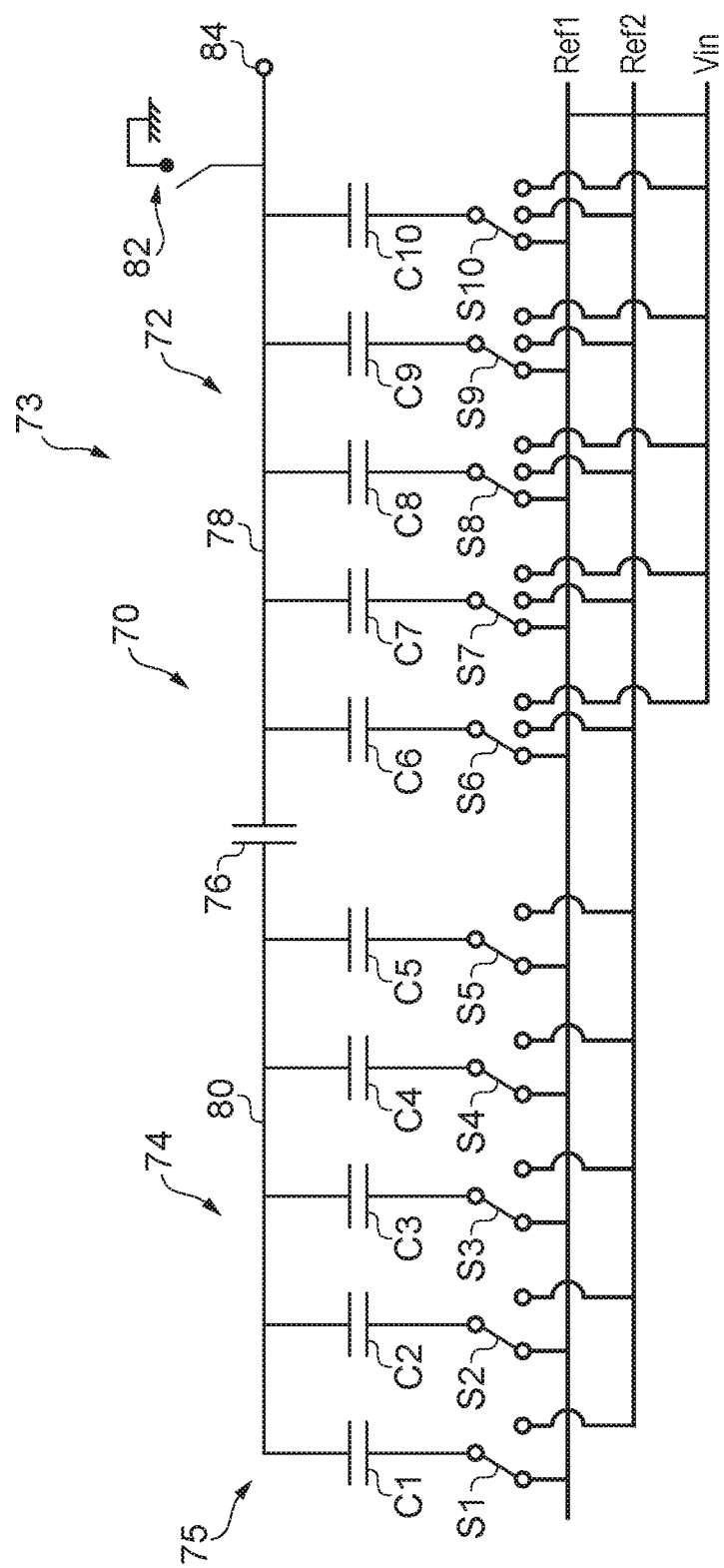
FIG. 2 schematically shows a two stage DAC where a first stage processes the more significant bits of the digital word presented to the DAC and can also be used to sample an input signal and the second stage processes the least significant bits of the digital word.

As noted above, the DAC can be implemented as a sub-divided or segmented capacitor array, for example as shown in FIG. 2. The sub-divided capacitor array, generally designated 70, comprises a first capacitor array 72 and a second capacitor array 74. The first capacitor array 72 comprises capacitors C6 to C10 configured to form a sampling capacitor DAC 73, like that discussed with respect to FIG. 1. The top plates of C6 to C10 are connected to a shared conductor 78 which connects to a node 84, to which a comparator may be connected and/or to which a residue amplifier may be connected. The purpose of a residue amplifier will be discussed later. The capacitors C6 to C10 have respective three position switches S6 to S10 such that the capacitors C6 to C10 can be connected to sample an input voltage Vin (with switch 82 acting as a sampling switch), to Ref1 or to Ref2. Capacitors C6 to C10 may be binary weighted to represent, for example, the five most significant bits of a 10 bit converter. One or more of the capacitors may be provided as a repeated weight, thereby reducing the number of bits from five to four or three, but allowing the converter to include redundancy such that it can recover form an incorrect bit trial decision. The second capacitor array 74 comprises capacitors C1 to C5 and acts as a sub-DAC 75. The sub-DAC 75 is connected to the sampling capacitor DAC 73 by way of a coupling capacitor 76. The capacitors C1 to C5 can form the five least significant bits of the DAC. The sub-DAC is, in this example, not a sampling DAC as the capacitors therein have no connections to Vin. The sub-DAC could be arranged to sample the input signal if desired.

The segmentation breaks the scaling between the capacitors and reduces the space required to implement the DAC. For example, in a 10 capacitor array without segmentation and without redundancy, the capacitor weights would follow the pattern C1=1, C2=2, C3=4, C4=8, C5=16, C6=32 and so on up to C10=512. Thus the total area required by the capacitors of such an array would be 1023 times the area of the unit capacitor. If the array was sub-divided into 2 arrays each containing 5 capacitors, the arrays being coupled by a coupling capacitor 76 of unit size, then we can see that C1=1, C2=2, . . . C5=16, C6=1, C7=2 and so on up to C10=16, and hence the capacitors of the array occupy an area of 63 times the area of the unit capacitor. This is a significant saving of space, and hence of cost.

In any switched capacitor array, be that sub-divided or non-sub-divided, the bit trials take time. Looking at FIG. 1 again, it is evident that switching any of the switches 40, 42 and 44 results in circulating current flows. Thus, if switch 40 is switched from Vref2 to Vref1 such that the bottom plate of capacitor 20 becomes increased in voltage, then a transient circulating current flow exists from capacitor 20 through capacitors 22 and 24 and their associated switches to Vref2. The current then flows through a storage capacitor 8 of the voltage reference 12 and back through the terminal Vref1 and switch 40 to the bottom plate of the first capacitor 20.

This current also flows along the bond wires of the integrated circuit between its external pins and the nodes Vref1 and Vref2 and also along conductor tracks within a printed circuit board to the voltage reference, or along bond wires in the co-packaged device. The tracks and the bond wires each exhibit a parasitic inductance and a parasitic resistance. These unwanted impedances are designated by inductor LP and resistor RP enclosed within a chain line 62 in FIG. 1 and also by similar parasitic components LP' and RP' in the path from the switched capacitor array to ground. Furthermore, the storage capacitor 8 will also exhibit an inductance and a resistance, and these parasitic components can also be represented within the values of LP and RP. Similarly the switches 40, 42 and 44 also exhibit a resistance which again can be represented within the value of RP.

The reference circuit comprises a reference voltage generator 16, which is a precision voltage reference of any suitable implementing technology, which optionally provides an output to an input of a buffer 18. The buffer 18 protects the voltage reference 16 from having to supply current to the switched capacitor digital to analog converter 10 within the analog to digital converter. By its very nature, the buffer 18 consumes power even when the analog to digital converter is inactive, for example because the ADC it has completed one conversion and is waiting until another one is scheduled.

At each operation of the switches 40, 42 and 44 the circulating current flows through the various capacitors and the parasitic inductor and resistor. The combination of the capacitors and inductors has the potential to form an LC circuit which may ring. In order to avoid this the circuit should be at least critically damped, or be close to critically damped. The resistance Rcritical of RP (see FIG. 1) for critical damping is $RP=(4L/C)^{1/2}$. The time constant Tcritical, for a circuit at critical damping is $(4LC)^{1/2}$. The settling time of the switched capacitor array, as determined by Tcritical, is limited by parasitic inductance LP and the capacitance C of the sampling DAC.

Some ADCs bring a copy of the reference voltage "on-chip" and avoid any circulating current through LP. Thus the reference voltage is brought within the same integrated circuit as the switched capacitor charge redistribution digital to analog converter within the ADC, thereby reducing the value of L. Such techniques can be used with the embodiments of this disclosure.

The ringing time of the DAC during bit trials is not the only limitation that affects the speed of the ADC. The sampling circuit also has a critical part to play. Although the sampling circuit is integrated within a sampling DAC, the issues around sampling circuit performance apply to all sampling circuit configurations. Consider the simplified ADC shown in FIG. 3.

Figure 3:
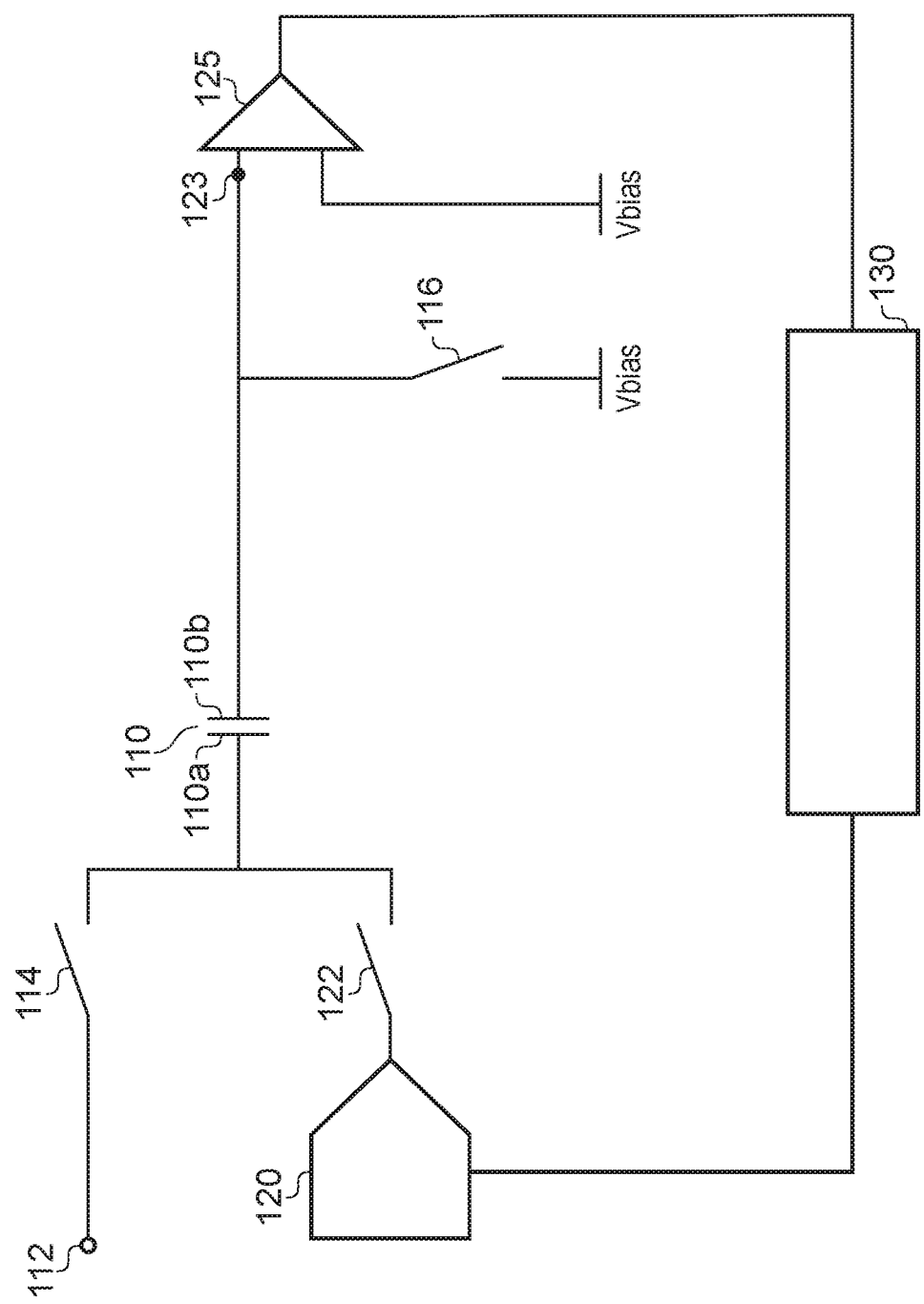
FIG. 3 shows a circuit diagram of a simplified sample (or track) and hold circuit such that the difficulties in building high speed analog to digital converters can be discussed.

The circuit in FIG. 3 comprises a sample capacitor 110 having first and second capacitor plates 110a and 110b, and where the first capacitor plate 110a can be selectively connected to or disconnected from an input node 112 at voltage Vin by a switch 114. The switch 114 is often formed by a field effect transistor, which has a high impedance when switched off, and a low but not well defined impedance when it is switched on, as the on state resistance of a FET can vary as a function of the gate to source voltage of the FET. In some circuits transmission gates using parallel NMOS and PMOS transistors are used to reduce the variation of input resistance as a function of Vin. Another approach is to use a bootstrap circuit to keep the gate voltage fixed with respect to the source voltage when the transistor switch is "on".

In this implementation a further switch 116 is provided to connect the second plate 110b of the sampling capacitor 110 to a reference voltage, Vbias, such as a local ground or better still Vref/2 where Vref represents the first reference voltage applied to the ADC, and the second reference voltage is taken to be 0V. When switches 114 and 116 are closed the capacitor 110 charges to the input voltage Vin on node 112 (or more strictly Vin–Vbias). When switch 116 opens, the charge on the capacitor 110 gets sampled and frozen on the capacitor 110. The circuit of FIG. 3 also includes a DAC 120 which can be of any suitable technology, for example switched capacitor or resistor based, and which can be connected to the plate 110a of the sampling capacitor via switch 122. Effectively the voltage stored on the capacitor 110 becomes subtracted from the voltage output from the DAC 120 at node 123, and the result of this subtraction is quantized to be negative or positive by a comparator 125 and the result provided to a controller 130, such as a state machine implementing a successive approximation search. The advantage of this topology is that the comparator only has to be good at making decisions around the voltage Vbias as opposed to being good over all possible input voltage ranges. The disadvantage of this topology is that the voltage at the input node 123 of the comparator may be driven significantly negative in the first 1 or 2 bit trials unless Vbias is set to Vref/2.

The capacitor will exchange charge with the input node by way on the resistance R of the switch, and the voltage $V_c$ across the capacitor will evolve as a function of time, t. where $\Delta V = V_{in} - V_{init}$ $$V_c = V_{init} + \Delta V \left( 1 - e^{\frac{-t}{RC}} \right) \quad \text{Equation 1}$$

Figure 4:
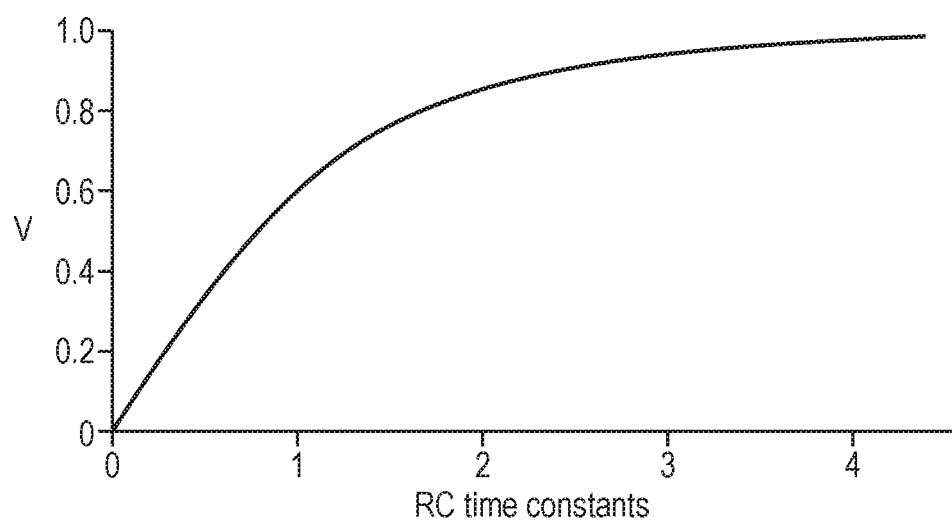
FIG. 4 is a graph showing the exponential evolution of a sampled voltage towards a target value as a function of time.

It can be appreciated from FIG. 4, that the voltage $V_c$ asymptotes towards $V_{in}$. The degree to which $V_c$ matches $V_{in}$ can be expressed as a function of time, measured in units of the RC time constant. In graphical form it looks as if one needs to only wait for several time constants until the sampling capacitor is charged. This however is misleading. Also, given that the sample time is generally a fixed period defined by digital electronics, then it is also worth considering the effect of component variation and hence changes in the RC value.

The following table, Table 1, shows the evolution of voltage from 0 to an arbitrary value of '1' expressed as a function of time constants Tc of a first RC combination as exemplified by a first sample and hold circuit and the voltage on a second sample and hold circuit where its time constant Tc' differs from Tc by being 10% larger.

Put another way, when the first sample and hold circuit has been acquiring the input voltage for 10 of its time constants, the second sample and hold has only seen 9 of its own time constants.

TABLE 1

| Tc | deviation from final value | Fractional voltage | Tc' | deviation from final value | Fractional voltage |
|----|---------------------------|--------------------|-----|---------------------------|--------------------|
| 1  | 0.367879441 | 0.632120559 | 0.9  | 0.40656966  | 0.59343034  |
| 2  | 0.135335283 | 0.864664717 | 1.8  | 0.165298888 | 0.834701112 |
| 3  | 0.049787068 | 0.950212932 | 2.7  | 0.067205513 | 0.932794487 |
| 4  | 0.018315639 | 0.981684361 | 3.6  | 0.027323722 | 0.972676278 |
| 5  | 0.006737947 | 0.993262053 | 4.5  | 0.011108997 | 0.988891003 |
| 6  | 0.002478752 | 0.997521248 | 5.4  | 0.004516581 | 0.995483419 |
| 7  | 0.000911882 | 0.999088118 | 6.3  | 0.001836305 | 0.998163695 |
| 8  | 0.000335463 | 0.999664537 | 7.2  | 0.000746586 | 0.999253414 |
| 9  | 0.00012341  | 0.99987659  | 8.1  | 0.000303539 | 0.999696461 |
| 10 | 4.53999E-05 | 0.9999546   | 9    | 0.00012341  | 0.99987659  |
| 11 | 1.67017E-05 | 0.999983298 | 9.9  | 5.01747E-05 | 0.999949825 |
| 12 | 6.14421E-06 | 0.999993856 | 10.8 | 2.03995E-05 | 0.9999796   |
| 13 | 2.26033E-06 | 0.99999774  | 11.7 | 8.29382E-06 | 0.999991706 |
| 14 | 8.31529E-07 | 0.999999168 | 12.6 | 3.37202E-06 | 0.999996628 |
| 15 | 3.05902E-07 | 0.999999694 | 13.5 | 1.37096E-06 | 0.999998629 |
| 16 | 1.12535E-07 | 0.999999887 | 14.4 | 5.5739E-07  | 0.999999443 |
| 17 | 4.13994E-08 | 0.999999959 | 15.3 | 2.26618E-07 | 0.999999773 |
| 18 | 1.523E-08   | 0.999999985 | 16.2 | 9.2136E-08  | 0.999999908 |
| 19 | 5.6028E-09  | 0.999999994 | 17.1 | 3.74597E-08 | 0.999999963 |
| 20 | 2.06115E-09 | 0.999999998 | 18   | 1.523E-08   | 0.999999985 |

Returning to considering the performance of the sampling stage, the transistors serving as switches 114 and 116 can offer a combined fixed impedance of RΩ when switched on. R is typically in the order of a few ohms to hundreds of ohms. Assuming a fixed value of R, it is worthwhile considering the value of C which should be selected. The following passages discuss the trade-off between sampling speed and noise, and how small component variations in the sampling circuit can introduce errors equivalent to several LSB of an analog to digital converter.

Assume that the capacitor has an initial voltage Vinit across it, and that at time T=0, the sample switch is instantaneously closed to connect the sampling capacitor to the input node 12 at voltage $V_{in}$.

After 10 time constants the first RC circuit is only in error by 0.0045% whilst the second RC circuit is in error by 0.012%. These numbers seem, at first sight, very small. However, these need to be considered in the context of the resolution of modern ADCs.

The following expresses resolution as a percentage of full scale value:

8 bits=0.390625%
10 bits=0.097656%
12 bits=0.024414%
14 bits=0.006104%
16 bits=0.001526%
18 bits=0.000381%
20 bits=0.000095%

Thus, waiting for 10 RC time constants is not sufficient to realize 14 bit resolution, since the sampled voltage would be more that 1 LSB in error.

Typically, for a 16 bit converter the sample circuit samples for at least 12 time constants; for 18 bit conversion the sampling circuit samples for at least 14 time constants, and for 20 bit conversion the sampling circuit samples for 15 time constants.

The performance of the transistor switches in terms of the on state resistance $R_{ON}$ is limited by the fabrication process. It is possible to put transistors in parallel or make a wider transistor to reduce $R_{ON}$, but this comes at a cost of increased charge injection from the gate of the transistor to the sampling capacitor, which can be viewed as a feature of the gate to channel parasitic capacitance of the transistor. Consequently making the transistor switches wider to reduce $R_{ON}$ compared to the value of the capacitor connected to the switch is not an automatic win as the charge injection problem worsens and degrades the accuracy of the analog to digital converter. However, as will be seen later embodiments of this disclosure allow the on resistance to be increased, and deliberately so, while still maintaining good speed and noise performance.

Another way to make the time constant smaller is to make the sampling capacitor smaller. This, however, hits another fundamental problem in the form of thermal (Johnson-Nyquist) noise. It is known that the thermal noise $V_n$ on a capacitor can be expressed as:

$$V_n = \sqrt{K_B \frac{T}{C}} \; RMS \qquad \text{Equation 2}$$

This noise is not caused by the capacitor as such, but rather by the thermodynamic fluctuations of the amount of charge on the capacitor due to the switch resistance. Once the capacitor is disconnected from a conducting circuit this random fluctuation is captured by the capacitor.

The RMS thermal noise, $N_{RMS}$, on a capacitor at 300K is set out below for a range of capacitor sizes:

| Capacitance | Noise Voltage |
|---|---|
| 1 nF | 2 µV |
| 100 pF | 6.4 µV |
| 10 pF | 20 µV |
| 1 pF | 64 µV |
| 100 fF | 200 µV |
| 10 fF | 640 µV |
| 1 fF | 2 mV |

The minimum capacitor size that can be tolerated within a sampling circuit can be calculated as a function of input resolution. It is known to the person skilled in the art that the maximum RMS signal value is related to Vref, and hence for an ADC the signal to noise ratio can be represented as:

$$SNR = 20 \log\left(\frac{\frac{Vref}{\sqrt{2}}}{N_{RMS}}\right) \qquad \text{Equation 3}$$

There is also a quantization noise contribution. The uncertainty in an ADC is ±½LSB. If this is error is assumed to be triangular across the analog input signal then the effective number of bits, ENOB, becomes $$ENOB = \frac{SNR - 1.76}{6.02} \qquad \text{Equation 4}$$

Suppose an ADC is to sample an input with a full scale range of 5V with 18 bit resolution. The LSB value is $5 \div 2^{18} = 19$ µV. However by the time the quantization noise is taken into account the sampling noise needs to be further reduced to around 11 $\mu V_{RMS}$. This indicates an input capacitance of around 40 pF if the noise is to be less than 1 LSB. If the full scale dynamic range is reduced then the LSB size is correspondingly reduced and the input capacitance has to be increased to obtain the same noise performance expressed in terms of bits.

The speed of the sampling stage is not the only factor that needs to be taken into consideration as the samples cannot be taken back-to-back as the ADC needs some time to make its conversion.

As noted before, a balance has to be struck between speed and power. Many ADCs are used in battery powered devices (such as mobile telephones/smart phones) where usable battery life is an important parameter. Furthermore, there is no point in having rapid conversion if the dynamic non-linearity of the converter is poor.

As a result of these trade-offs, a suitable technology that can achieve both resolution and relatively low power is a switched capacitor ADC where the switched capacitor array can function both as the sampling capacitor and a bit trial DAC.

As noted before, the process of trialing the bits by switching the capacitors between the reference voltages causes charge redistribution inside the DAC, the charge flowing through the transistor switches and hence subject to an RC time constant. Also the switching of the capacitors to and from the reference voltage causes abrupt charge draws from the reference voltage, which interact with the inductance of the conductors/tracks between the reference voltage and the capacitors, and with the capacitance of the capacitors themselves to introduce ringing.

Both the ringing and the capacitor to capacitor charge redistribution limit the conversion rate. The ringing needs to be given time to subside below an appropriate value, such as 1 LSB (or the amount of error that redundancy within the ADC can reasonably be expected to correct), and the charge redistribution also needs to be asymptote to an appropriate value. Luckily it turns out that we do not need to wait 14 to 16 time constants after setting the bits in a bit trial before strobing the comparator to look at the result of the bit trial. In practice it is reasonable to wait for a much shorter time, say around 4 time constants in a converter having redundancy. It can be seen that this could add a further (18+3) 4=84 time constants to the conversion time for am 18 bit converter having 3 redundant bits. On a simplistic estimate, with an $R_{ON}$ of 10 ohm and a capacitance of 40 pF, and where the sampling capacitor was also involved in the bit trials of a successive approximation converter, and the settling time on average of 14 time constants is allowed for each sampling of the input signal, this would suggest a conversion rate of around $1/(10 \times 40 \times 10^{-12} \times (14+84)) \approx 25$ MHz.

Pipelining allows the bit trials to be split between different stages of an ADC and whilst the conversion time between taking a sample and outputting a result is not improved by pipelining the throughput or conversion rate is nearly doubled in a two stage pipeline. The other benefit of pipelining is the amplification of the signal, thus the comparators can make faster decisions.

Figure 5:
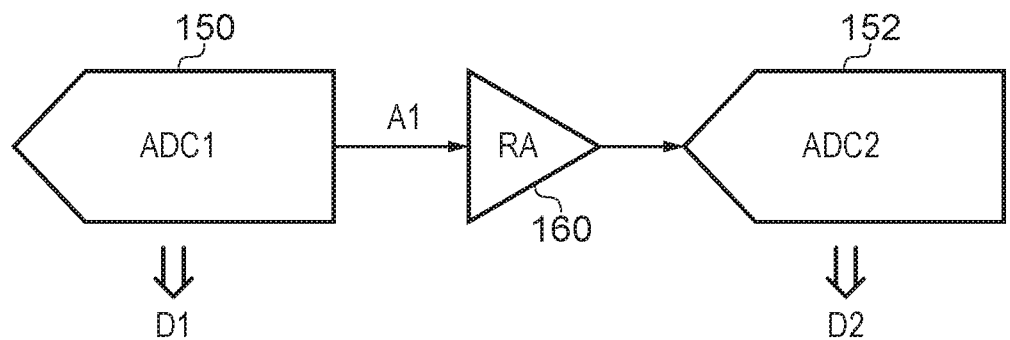
FIG. 5 is a schematic diagram of a pipeline converter having two stages and a residue amplifier.

Pipelining also allows a residue, which represents the difference between the analog value that was sampled and the digital approximation of that analog value to be formed and gained up before being passed to a subsequent stage of the pipelined converter. Pipelining also allows different stages of the pipeline to be formed with different resolutions and/or of different analog to digital converter technologies. FIG. 5 shows a schematic diagram of a two stage pipeline converter.

Here a first analog to digital converter 150 performs part of a conversion, and outputs a digital result D1 which represents the analog input value to a limited resolution, for example between 4 and 10 bits (these suggestions are not limiting). The analog to digital converter 150 is also arranged to output an analog value A1 representing the difference between Vin and the equivalent analog value of D1. The switched capacitor arrays shown in FIGS. 1 and 2 do this naturally as part of the conversion process and hence no additional overhead is incurred in forming A1, which is known as a "residue". The residue is subjected to further analog to digital conversion by a second analog to digital converter 152. The second analog to digital converter 152 can generate digital result D2 based on A1. The residue A1 can be amplified by an amplifier 160. This is beneficial as it reduces the effect of offsets within the comparator of the second converter.

The pipelining means that rather than a single ADC having to do, say 16 or 18 bit trials, the first ADC 150 can do a number of the trials, say 8 or 9, and the second ADC 152 can do the remaining trials. As each ADC only does half the number of bit trials the effective conversion rate is doubled as ADC1 not only takes half the time before being able to accept a new input for conversion. ADC1 can be working on an N+1th conversion while the second converter ADC2 finishes the Nth conversion. This has assumed that there is no time overhead in receiving and amplifying the residue. Additionally the settling time in the second ADC can be reduced compared to that of the first ADC as it is not necessarily subjected to such large amounts of current flow during its bit trials and any errors that it makes are by definition less significant, as they relate to lesser significant bits.

Figure 6:
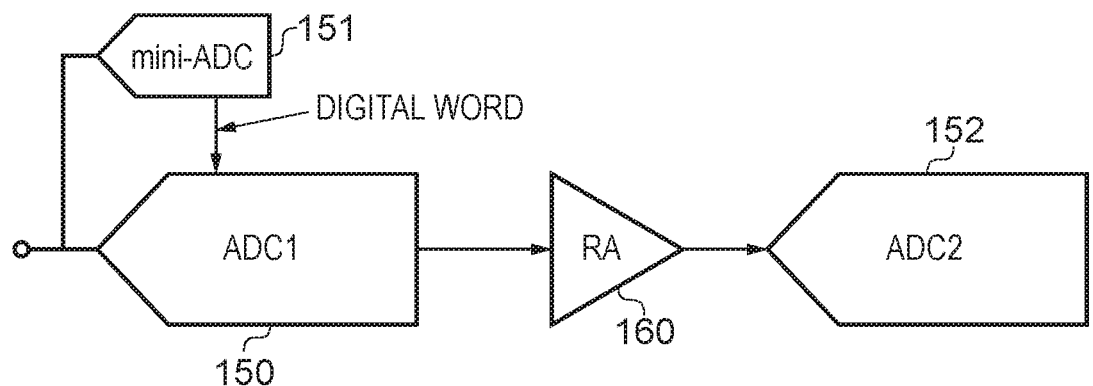
FIG. 6 is a modification to the arrangement shown in FIG. 5 so as to add a mini ADC to the first stage of the pipeline.

The speed of conversion, and hence throughput, can be increased by performing some of the bit trials rapidly—for example by performing the first two, three or four trials using a Flash ADC and the remaining bit trials using a successive approximation search (or some other ADC strategy). Such an arrangement is shown in FIG. 6 where a mini ADC 151, such as a Flash ADC, can perform two or three of the bit trials rapidly and with less accuracy and pass the result to the first ADC 150 as a starting point for its bit trials. Any errors, such as incorrect decisions can be recovered from since the error will be encoded into the residue and is removed by the second ADC 152.

Achieving Higher Sampling Rates without Incurring Noise Penalties

Despite all these approaches, there is still a desire to work at even higher sampling rates without incurring noise penalties. The problem is, as noted before, that none of the solutions are easy. Smaller sampling capacitors reduce the RC time constant and hence allow higher throughput, but at the expense of increased thermal noise.

The inventors realized that an architectural change could be made to partially decouple the problems of noise from speed, as improving noise performance suggests the use of more capacitance whereas improving speed performance suggests the use of smaller capacitance. The inventors noted that these problems could be mitigated by use of multiple DACs, for example formed of switched capacitors arrays operating in cooperation as "slices" within a single ADC block—which could be an instance of one converter within a segmented converter or be a converter in its own right.

Thus an ADC may be split into a plurality of channels or slices. The slices can be made with relatively small values of capacitance such that a slice can be used to perform an ADC conversion and arrive at an interim result relatively quickly but with a noise penalty. The interim result can be used by one or more other slices to form a residue. The one or more other slices may have bigger values of C, or work in parallel to synthesize a bigger value of C such that the residue has an improved thermal noise figure.

Operating a plurality of sampling stages in parallel is not as simple as merely connecting a load of stages together. That, as with many things in high speed analog to digital converters overlooks some of the fundamental physics that makes this task so challenging.

The stages should be "matched" to set their RC time constant to within an acceptable value. The limit of what constitutes "acceptable" depends on a time budget for sampling the input signal and also for allowing charge redistribution and ringing to settle to around 1 LSB of the channel or slice. The problem of RC time constant mismatch was described earlier in the context of a Direct Current (DC) signal. The following passages will describe the problem of RC time constant mismatch with Alternating Current (AC) signals.

Looking more specifically at the sampling problem, this is once again a function of the dynamic range of the converter and its maximum bandwidth.

Suppose a sampler samples a sinusoid, Vinput, having a dynamic range of 5V at 10 MHz. This has an amplitude of 2.5 V and an angular frequency of $2\pi \times 10 \times 10^6$ radians per second.

$$V\text{input} = 2.5 \sin(2\pi \times 10 \times 10^6) \qquad \text{Equation 5}$$

The maximum rate of change of voltage occurs around the zero crossing point and is $2.5 \times 2 \times \pi \times 10 \times 10^6 = 157 \times 10^6$ volts per second.

So 1 picosecond of sampling skew (a timing error) would equate to 157 µV of error. For a dynamic range of 5V and 18 bit resolution, the LSB size was 19 µV. Therefore this small timing skew of 1 ps introduces an error of 8.3 LSB. This timing skew interacts with any variations in RC time constant between stages or slices to increase mismatch errors in the voltage sampled onto each slice.

To address this the inventors have chosen an architecture where for each slice integrated circuit lithographic precision is used to ensure that the capacitors and transistors in each sampling arrangement scale together to maintain a matched RC sampling time constant, and the sampling switches are substantially co-located to minimize timing skew.

In an embodiment where the slices are formed from switched capacitor arrays, each slice includes a sampling DAC, and the sampling stages are matched so as to have capacitors and transistors at a given electrical position in one slice being substantially the same as the equivalent capacitors and transistors in others of the slices.

In an embodiment of this disclosure a unit cell comprising a unit size capacitor C in association with unit sized transistors for connecting one of the plates of the capacitor to Vin, Ref1 and Ref2 respectively is used repeatedly to form the slices. Each unit cell is nominally identical to each other unit cell in its electrical performance. The cells can be grouped together, either permanently on or as part of a dynamic allocation of cells to groups. Two cells can be grouped together to form C7 (from FIG. 2) having a capacitance of 2C, four cells can be grouped together to form C8 having a capacitance of 4C, 8 cells can be grouped together to form C9 and so on. If desired, cells do not need to be grouped together to from groups in a binary sequence of weights. Cells could be grouped to form capacitors to provide redundancy. Cells can also be connected in series to form effective capacitances of C/2, C/3, C/4 and so on.

The slices may be connected to a sub-DAC, such as the one comprising C1 to C5 in FIG. 2.

Returning to the issue of matching the RC time constants, these have an effect on sampling AC signals. Table 1 shows that changes in the time constant can give rise to significant errors in the sampled value of a DC signal. However, ADCs often sample varying (AC) signals.

It is desirable for the slices to sample the same value, to within acceptable limits, but this raises the question of how important is the matching when looking at AC signals. The inventors appreciated that the issue of matching has been overlooked in the past. A paper "A 1 mW 71.5 dB SNDR 50 MS/s 13 bit fully differential ring amplifier based SAR assisted pipeline ADC", Yong Lim and Michael P Flynn, IEEE Journal of Solid State Circuits, Vol. 50, No. 12 December 2015, shows a circuit (described with respect to FIGS. 6 and 16 of the paper) where a first stage of a pipeline converter resolves the 6 MSB of the signal to be digitized. The input signal Vin is sampled onto two sampling DACs. One sampling DAC, called "Big DAC" has three times the capacitance of the other sampling DAC, called "Small DAC". The small DAC is used to perform the SAR trials, so as to save power, but once it has finished then both DACs are connected to a common node such that their residues are merged together in order to meet the 13 bit noise requirement. However there is no teaching of scaling the transistor switches to match the sampling time constants of the DACs nor of co-locating the sampling switches to minimize timing skews.

The effect of the change in the RC time constant is most easily understood if treated as being a phase shift.

The phase shift can be modelled as that of an RC low pass filter, where the phase shift φ is given by $$\phi = -\arctan(2\pi f RC) \quad \text{Equation 6}$$

Suppose that it is desirable to design a RC sampling circuit to have a −3 dB bandwidth of 10 MHz. Suppose also that C has been chosen to be 40 pF in order to meet the noise performance figure required to achieve 18 bits of resolution. As for f=10 MHz, and $$f = \frac{1}{2\pi RC} \quad \text{Equation 7}$$

C=40 pF then we can use equation 7 to calculate the value of R, finding R=40Ω.

Evaluating Equation 6 based on values of f, R, and C, the phase shift can be determined:

$$\phi = -\arctan(2 \cdot \pi \cdot 10 \times 10^6 \times 40 \times 40 \times 10^{-12})$$

$$\phi = -0.10019 \text{ rad}$$

At first sight this phase shift looks negligible. However, if RC changes by +10%

$$\phi = -0.11013 \text{ rad}$$

This is a difference of 0.001 rad, which equates to a time difference of $$\frac{0.001}{2 \cdot \pi} \times \frac{1}{10 \times 10^6} = 1.59 \times 10^{-11} \text{ seconds}$$

Thus, in this example a change of 10% in the RC time constant yields a minute phase change at 10 MHz of $1 \times 10^{-3}$ radians, but this phase change turns out to be equivalent to 16 picoseconds timing error which equates to a mismatch between the slices of 133 LSB for a 5 V peak-to-peak input signal at 10 MHz.

The above calculation shows that mismatches in component values manifest themselves as large sampling time errors as the frequency increases. However this problem seems to have been overlooked in the past.

Having noted that variations in the RC value of a sampling stage can introduce phase small phase shifts which can manifest themselves as many LSB of error, the inventors have, in some embodiments of this disclosure, taken the step of adding a series resistor into the RC sampling circuit. This is counter intuitive since adding a resistor clearly lowers the bandwidth of the circuit and hence increases the sampling time for an input signal. Such as approach is diametrically opposing the steps that would be taken to build a fast ADC. However, the effective "on" impedance of the transistor switches may change with temperature and input voltage by a few percent and although careful layout and bootstrapping can go a long way to reducing variation, adding a series resistor (whose thermal performance is more stable than a transistor) can improve the matching between slices. The resistors may have values between ohms and several hundred ohms. In an embodiment resistors of around 160Ω were used. The transistors may have on resistances of only a few ohm, and transistor to transistor on resistance variation may only be fractions of an Ohm. This approach significantly improves matching between the sampling DAC slices.

As a result, it is preferable to make the sampling section of each slice nominally identical to the sampling sections of each of the other slices.

Figure 7:
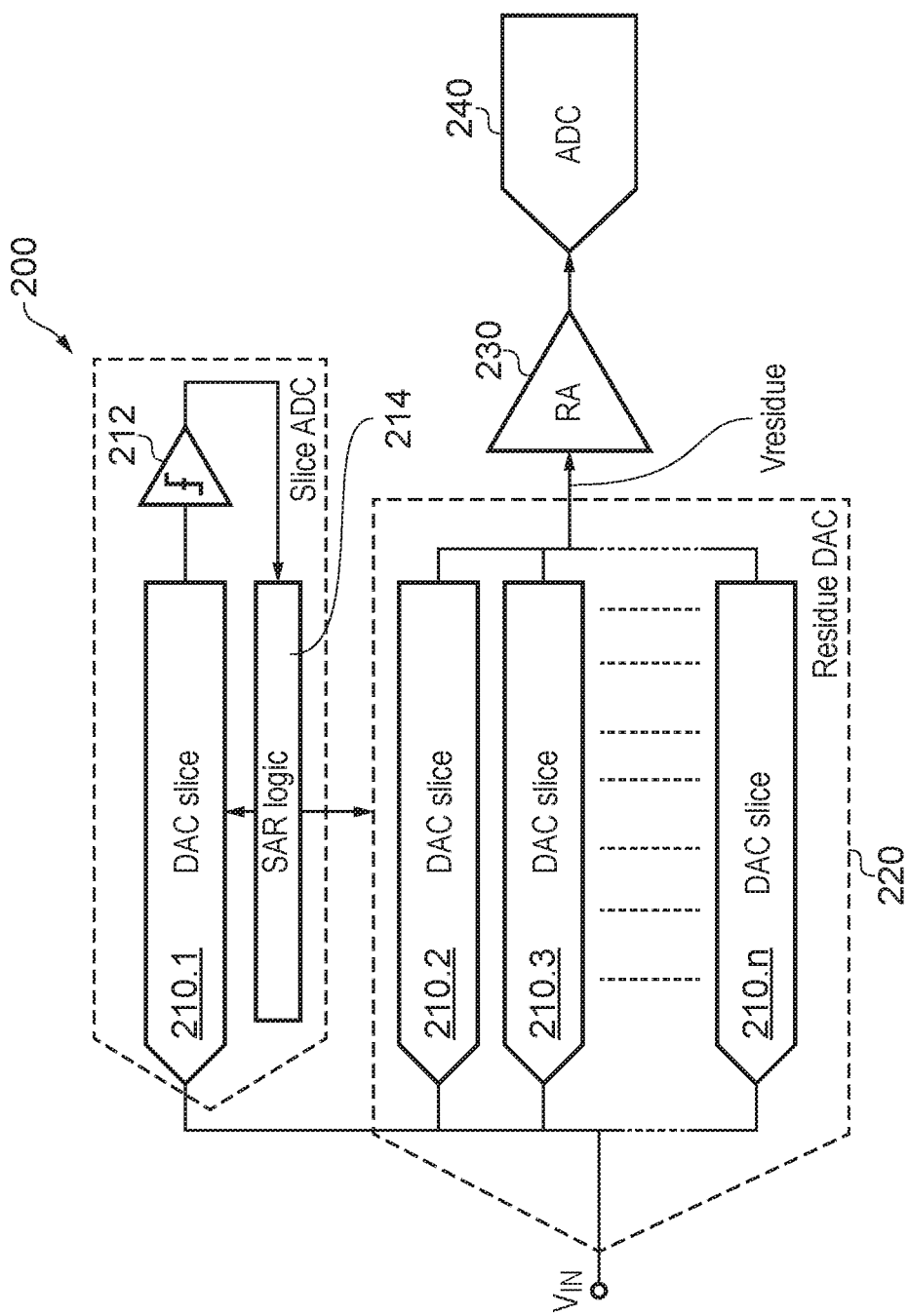
FIG. 7 is a schematic diagram of a multi-slice conversion stage in accordance with the teachings of this disclosure.

FIG. 7 schematically illustrates a circuit 200 constituting an embodiment of the present disclosure. The circuit comprises a plurality of sampling circuits and a plurality of digital to analog converters. The circuit may form the entirety of an analog to digital converter, or more likely is used as a "stage" of a multistage converter, such as a pipelined converter as shown in FIG. 5 or 6 where the pipeline can have two or more stages. In this embodiment switched capacitor arrays are used for forming sampling digital to analog converters, with each sampling DAC acting as one slice 210.1 to 210.$n$ of the circuit 200. The slices 210.1 to 210.$n$ are advantageously reconfigurable such that one or more slices 210.1 to 210.$n$ can be associated with a SAR controller and that other ones of the slices can be updated as a function of the SAR output. In this context "updated as a function of" includes the possibility that different ones of the slices may be updated or set to respective values which may be different from the SAR value. However, for the time being the first slice 210.1 is assumed to have been coupled to a comparator 210 which provides its output to a SAR controller 214. The SAR controller may be a state machine arranged to drive the sampling DAC slice 210.1 to perform an analog to digital conversion using, in this example, the slice 210.1 to resolve a plurality of the bits of a digital output word.

Some or all of the remaining DAC slices 210.2 to 210.$n$ are configured to sample the input Vin simultaneously with slice 210.1 and to act together to form a residue DAC 220 to form an analog output voltage Vresidue representing the difference between Vin and Vdac, where Vdac is the voltage produced by the residue DAC 220 when driven with the "result" of the analog to digital conversion formed by the first DAC slice 210.1 when driven by the SAR controller 214 to arrive at a P bit conversion, where P is the effective resolution in bits of the slice 210.1.

The first DAC slice 210.1 may be formed from a non-subdivided switched capacitor array as shown in FIG. 1, a segmented or sub-divided switched capacitor array as shown in FIG. 2 or a sampling capacitor and associated DAC as shown in FIG. 3. Given that sub-divided arrays as shown in FIG. 2 are commonly used because of their relative compactness, then for the purposes of this part of the description we shall assume that the slice 210.1 comprises a sub-divided array like that shown in FIG. 2.

In such an arrangement, the sampling DAC stage 73, as shown in FIG. 2, is connected to a sub-DAC stage 75. The other slices can be formed so as to be identical to the first slice 210.1, i.e. including both a sampling DAC stage and a sub-DAC. However, it is also possible to use a shortened sub-DAC or to omit the sub-DAC all together as long as the coupling capacitance is adjusted and coupled to ground or placed in series with a capacitance replicating the capacitance of the sub-DAC.

In use each of the slices 210.1 to 210.$n$ is coupled to Vin and used to sample Vin. The sampling switches 82 (see FIG. 2) of the slices are co-located to ensure that they receive their "hold" instruction at the same time and also to ensure that each switch 82 suffers the same process, voltage, and temperature (PVT) variation as each other switch. This helps ensure that each sampling DAC circuit has the same electrical performance as each other sampling DAC, for example matched RC time constants, and the switches 82 transition between conducting and non-conducting at the same slew rate and at the same time, thereby avoiding phase shifts between the DAC slices 210.1 to 210.$n$ when operating concurrently to acquire, (for example sample and hold) a shared input signal.

After the input signal has been acquired, the first DAC slice 210.1 can be used to form a successive approximation routine conversion of the sampled signal. Such a conversion may include use of a further sub-ADC, for example in the form of a Flash ADC to provide a near instantaneous conversion of the first two or three bits of the P bit conversion performed by the DAC slice 210.1. Given that the methodology for performing a SAR conversion is well known to the person skilled in the art it is not described further here, except to point out that such conversions can also include the inclusion of additional bits to provide redundancy in the result and that the conversion can also be performed with radix <2 technology and that multiple bits can be determined in a single bit trail period as known to the person skilled in the art, for example by using a three level quantizer in place of the comparator. As the bit trial progresses, the status of the most significant bits of the P bit output word become known before the status of the least significant bits of the P bit output word. This allows the output from the SAR logic 214 to be provided to the slices 210.2 to 210.$n$ in the residue DAC 220 in order to set the bits in those DAC slices on a bit by bit basis thereby allowing the voltage transitions caused by switching the capacitors in each slice into an appropriate configuration, and the ringing that this may introduce, has time to die away before the output from the residue DAC 220 is gained up by the residue amplifier 230.

In order to reduce the magnitude of voltage transitions the setting of the bits in the slices 210.2 to 210.$n$ within the residue DAC 220 can be staggered in time such that the transitions do not happen in unison. Furthermore, the magnitude of the initial transitions, for example relating to the most significant bit and the next most significant bit can be reduced by initially setting half of the slices 210.2 to 210.$n$ with their most significant bits set and the other half of the slices with their most significant bit unset. Consequently, as a result of the first bit trial statistically only half of the DAC slices are likely to have to be transitioned. The same technique can be used with the next most significant bit and so on. An alternative approach may be based on the fact that, in use, the input signal may be oversampled compared to its Nyquist frequency limit and hence statistically the first few bits of the input word are unlikely to have changed between one sample and an immediately following one.

It is also possible to allow one or more DACs within the residue DAC to participate within several of the bit trials. Put another way, if only DAC slice 210.1 is being used to perform analog to digital conversions then that single DAC slice can only perform one bit trial at a time. However if three of the DAC slices, for example 210.2, 210.3 and 210.4 of the residue DAC 220 are temporarily enabled to work with respective comparators (not shown) coupled to the SAR logic 214 then the arrangement shown in FIG. 7 can perform two bit trials simultaneously, thereby reducing the time required for the stage 200 to convert P bits.

The use of the slice arrangement allows each DAC slice 210.1 to 210.$n$ to have a smaller capacitance therein, which reduces the RC time constant of each DAC slice, and consequently a conversion could be performed more quickly. Earlier on in this description, the thermal noise associated with a capacitor at 300 K was tabulated. This was used to show that, in a worked example where a dynamic range of 5 V was to be converted with 18 bit resolution, then the minimum capacitance of the DAC needed to be at least ~40 pF. However, if all of the DAC slices where formed such that they each had an effective capacitance of 4 pF then connecting the DAC slices 210.2 to 210.$n$ to form a residue DAC places their capacitances in parallel. Thus, if 10 DAC slices 210.2 to 210.11 were provided in the residue DAC 220, then connecting them in parallel would create an effective capacitance of 40 pF even though each residue DAC had the superior sampling time and settling speed associated with being a 4 pF DAC slice. It should further be noted that the residue at the output of the first DAC slice 210.1 can also be connected to the output of the residue DAC 220 such that it also contributes to the reduction of thermal noise of the bank of capacitors.

Figure 8:
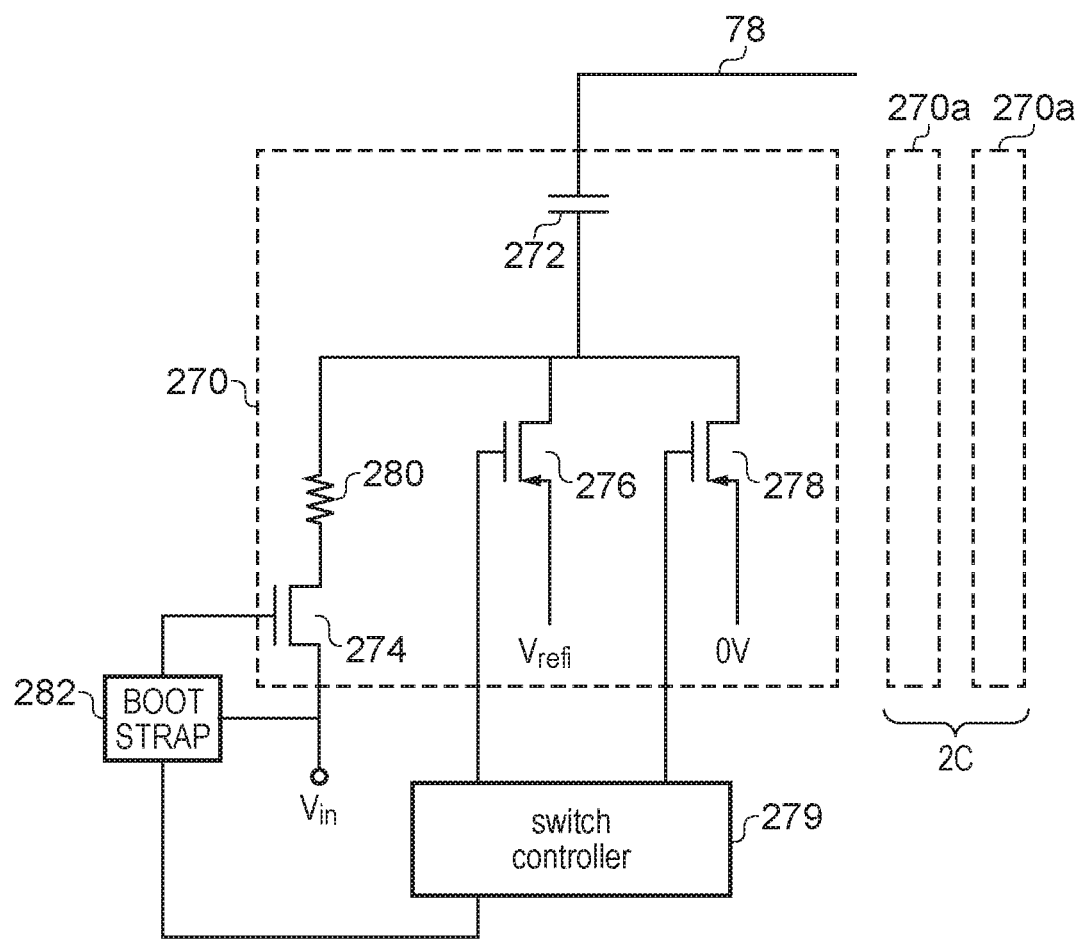
FIG. 8 shows a structure of a unit cell according to embodiments of this disclosure.

As noted earlier, the sampling DACs can be formed from repeated unit cells. One such unit cell 270 having a value 1C is shown in FIG. 8. The unit cell comprises a capacitor 272 having a value of 1C. One of its plates, the uppermost plate in FIG. 8, is connected to the shared conductor 78 (FIG. 2). The bottom plate of the capacitor is connected by a three-way switch formed of transistors 274, 276 and 278 to allow the bottom plate to be isolated, connected to Vin, Vref1 (typically from a precision voltage reference such as buffer 18 from FIG. 1) or Vref 2 (typically 0V). Each of the transistors is controlled by a switch controller 279, such as SAR logic block 214 from FIG. 7. The transistor 274 connecting the capacitor to the input node Vin may be in series with a resistor 280 so as to more accurately define the "on" resistance presented by the unit cell when it is sampling the input signal at Vin. The transistor 274 may have its gate control signal modified by a bootstrap circuit 282 so as to hold Vgs of the transistor 274 constant with respect to Vin. Bootstrap circuits are known to the person skilled in the art. The unit cell 270 may be placed in parallel with other unit cells to form properly scaled combinations of switch and capacitor, as represented by unit cells 270a and 270b being placed in parallel to form a 2C weight, and so on.

If, for example, only 5 binary weighted sampling capacitors are required in the sampling part 73 of the sub-divided switched capacitor DAC (FIG. 2) then it follows that $2^5-1=31$ unit cells 270 are required. The unit cells can be very well matched within an integrated circuit. This means that the unit cells may be permanently assigned to groups of 1, 2, 4, 8, and 16 if desired, or alternatively the groupings may be dynamically formed on the fly by the switch controller at each sampling event to randomize any mismatch errors.

Figure 9:
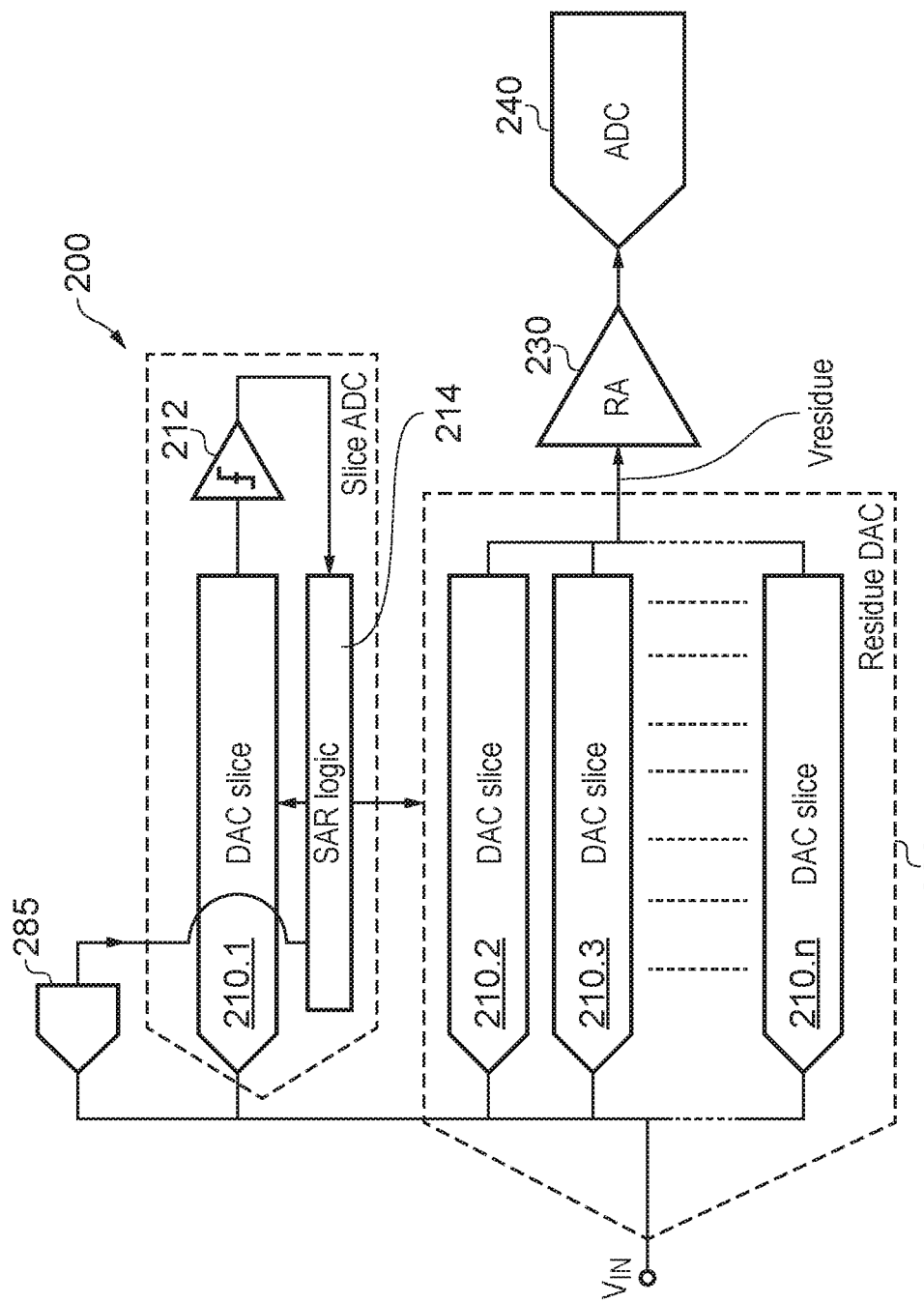
FIG. 9 shows a variation to the arrangement shown in FIG. 7.

FIG. 9 shows a variation of FIG. 7 where a mini-ADC 285, such as a 3 bit Flash converter, is used to set the three most significant bits of the SAR converter more quickly. Less than or more than 3 bits may be converted by the Flash converter 285.

Figure 10:
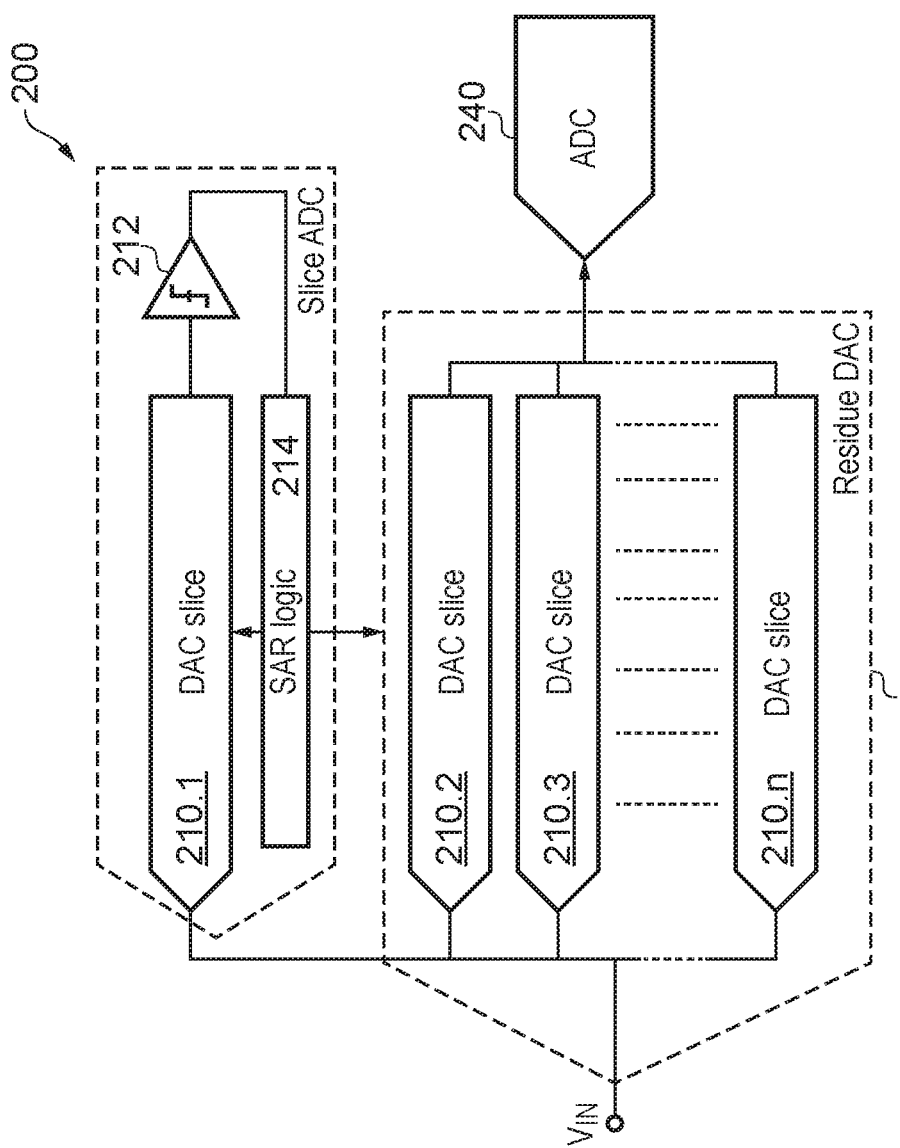
FIG. 10 is a schematic diagram showing further modifications to the arrangement shown in FIG. 7 where the residue amplifier is omitted.

The voltage residue may then be gained up by a residue amplifier 230 before being provided to a further analog to digital converter 240. It should also be noted, as shown in FIG. 10, that the residue amplifier 230 need not necessarily be provided.

Figure 11:
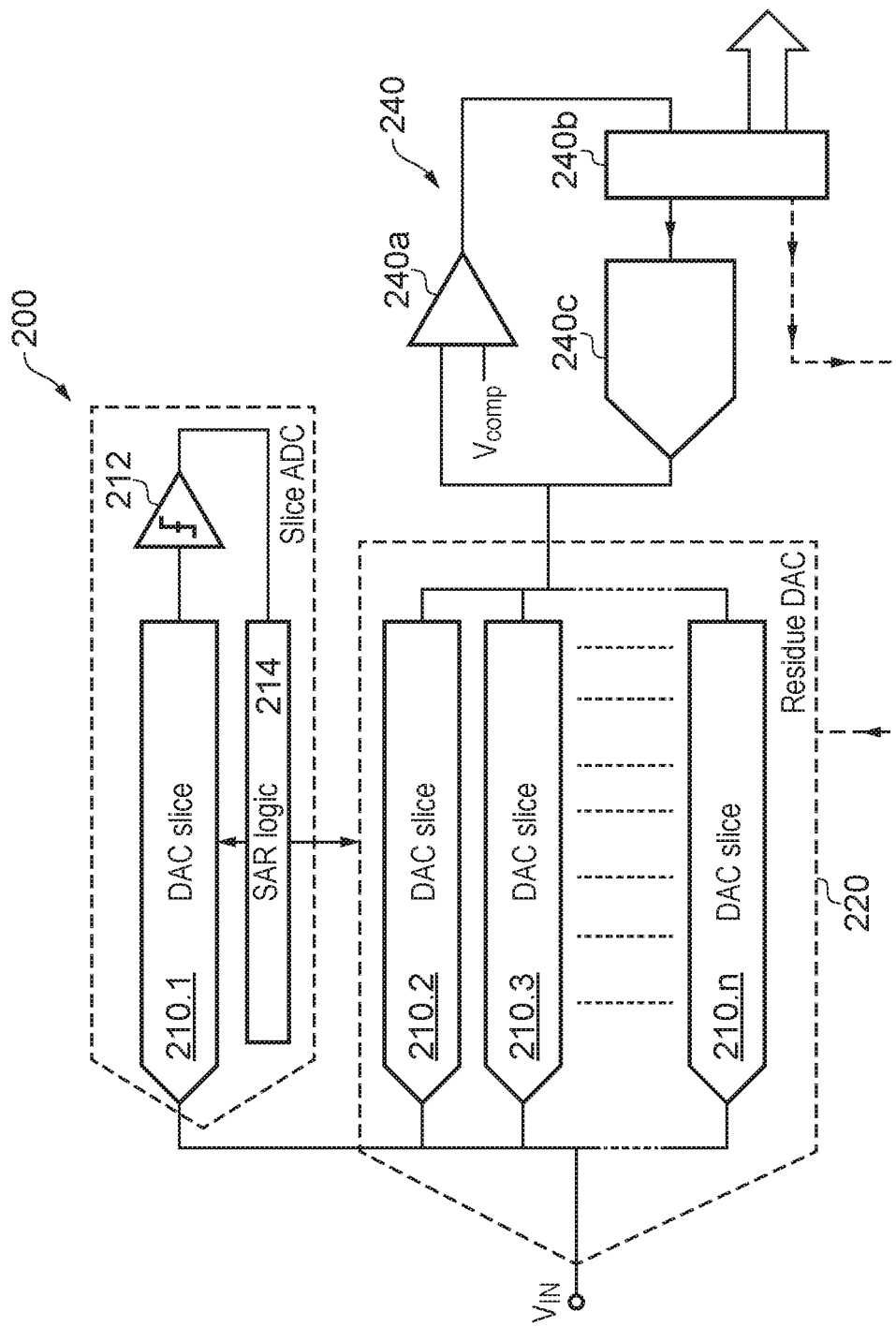
FIG. 11 is a schematic diagram illustrating a further modification where a second stage ADC is arranged to control the DAC slices of the first stage.

FIG. 11 shows a modification that can be applied to any of the arrangements described herein where the second DAC 240 can be allowed to modify the switch positions within the residue DAC 220. This may enable the ADC 240 to modify the residue (and the digital word from the first DAC 200) if the residue is inconveniently too large for the residue amplifier or for the comparator in the second ADC to handle without compromising their linearity. In this example the second ADC 240 is implemented as a SAR ADC comprising a comparator 240a, a SAR controller 240b and a DAC 240c.

Figure 12:
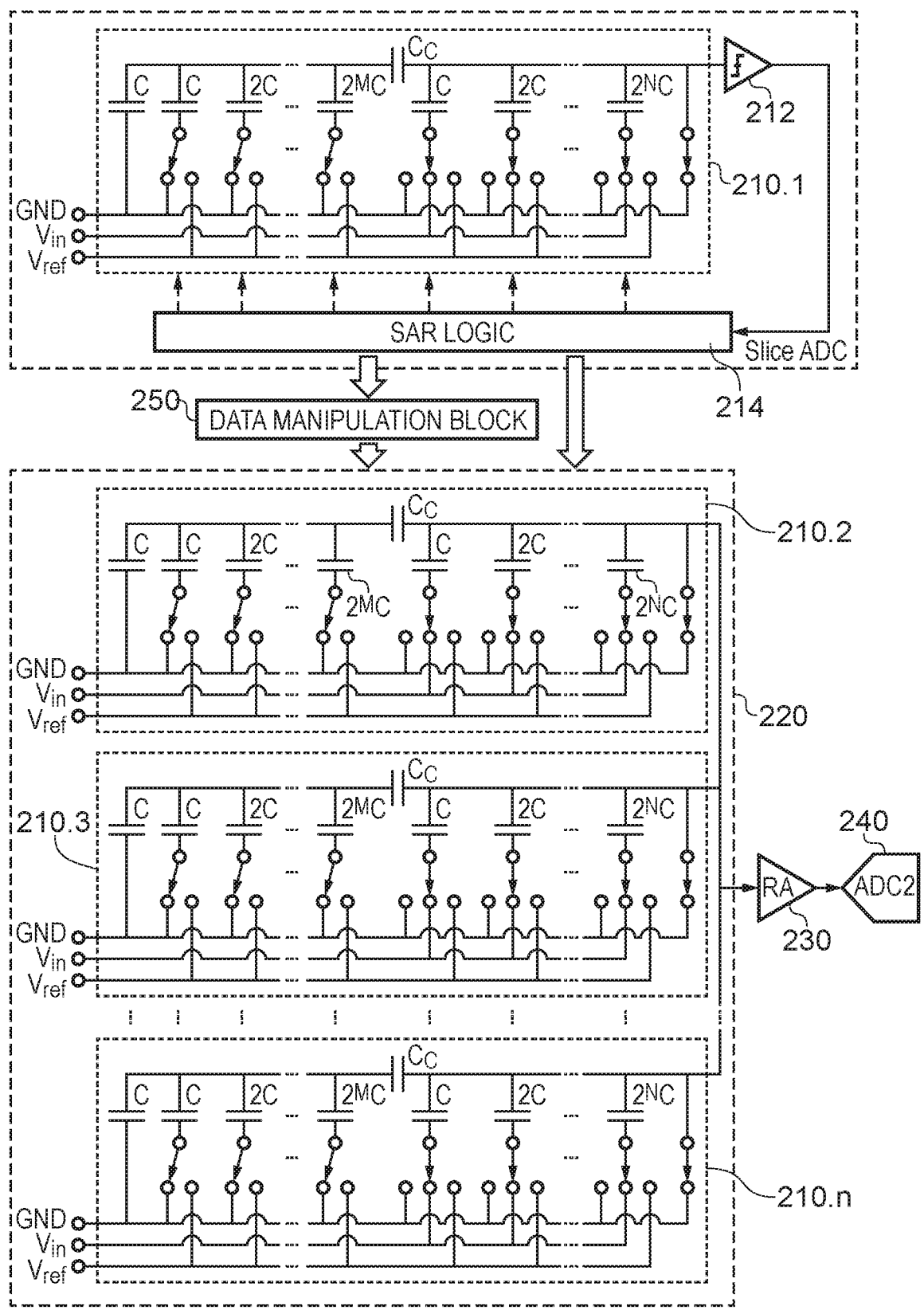
FIG. 12 is a circuit diagram showing details of an embodiment of the stage shown in FIG. 7 in greater detail.

FIG. 12 schematically shows the circuit arrangement of FIG. 7 in greater detail. In this example each of the slices 210.1 to 210.n are identical, and each comprise a segmented capacitor array forming a sampling DAC together with a sub-DAC. The sampling DACs are identical. Furthermore, in this configuration shown in FIG. 12 the sub-DACs are also identical. However this need not be the case. The sub-DACs could be formed with lower resolution if desired. Suppose, for example, that the DAC slice 210.1 was an 8 bit slice, comprising 5 bits (N=5) in its main DAC and 3 bits (M=3) in its sub-DAC if 8 DAC slices 210.2 to 210.9 are provided in the residue DAC 220 then these 8 residue DACs effectively could be driven with different control words to provide a further 3 bits of resolution, within the sub or main DAC the bring the residue DAC back up to an 8 bit device. Thus the sub-DACs of the slices 210.2 to 210.n can be shortened or omitted if desired. Alternatively, if the slices are all the same as shown in FIG. 12, then the residue DAC can be driven to apply sub-LSB dither to its output signal for supply to the next stage in the pipelined analog to digital converter. These approaches can be adopted together.

In the arrangement shown in FIG. 12 a data manipulation block 250 is provided between the SAR register 214 and each of the slices 210.2 to 210.n in the residue DAC 220. The data manipulation block allows the digital word to each of the DAC slices 210.2 to 210.n to be individually set. Thus deliberately selecting different words provide for enhanced resolution or the incorporation of dither.

Figure 13:
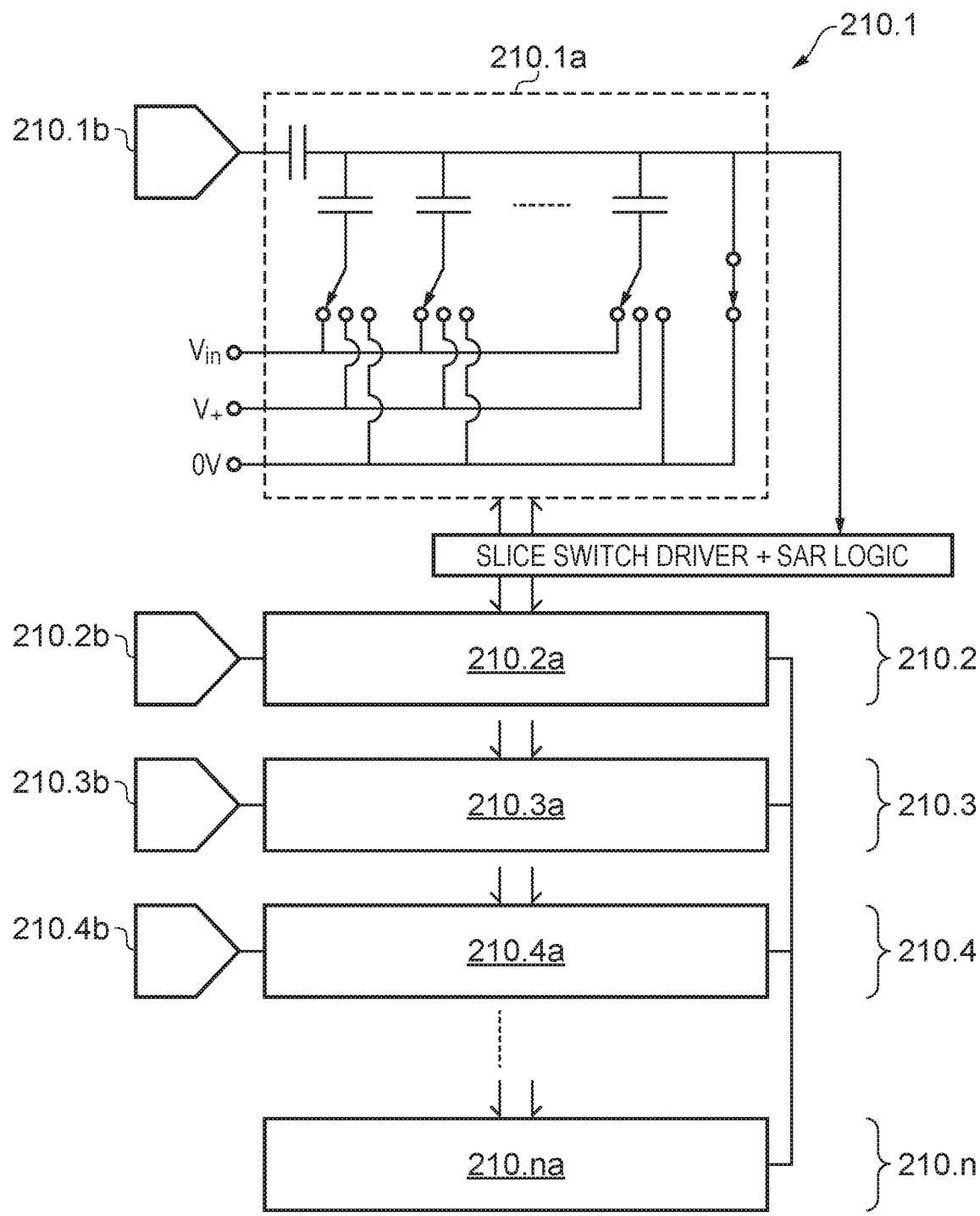
FIG. 13 is a circuit diagram of a variation of the circuit shown in FIG. 12.

FIG. 13 is a generic representation of FIG. 12 where each slice 210.1 to 210.n is divided into a sampling DAC portion 210.1a, 210.2a and so on up to 210.na and a sub-DAC 210.1b, 210.2b, 210.3b and so on. The slice sampling DACs 210.2a to 210.na are identical to each other. The sampling DAC 210.1a may or may not be the same as the sampling DACs 210.2a to 210.na, but advantageously has very similar electrical properties and this is best achieved by forming it of the same unit cell construction as the other slices. The sub-DACs need not be the same. The sub-DAC 210.1b may be formed, for example, with more bits than the other sub-DACs. Indeed not all of the slices need be provided with a sub-DAC. Here the sub-DAC associated with sampling DAC 210.na has been omitted.

It was noted earlier in this disclosure that the current flow between the capacitors along the bond wires can perturb the voltage reference. Indeed, in the arrangement shown in FIG. 1 the voltage reference was buffered by a buffer amplifier in order to reduce the perturbation applied to it. The arrangement described herein has the advantage of reducing the perturbation of the voltage reference during the bit trial sequence and also gives the potential for the DAC slices 210.2 to 210.n in the residue DAC to be provided with a buffered version of the reference voltages which may be provided by way of a further buffer such that the reference voltage provided to the first slice 210.1 does not suffer perturbation due to switching of the capacitors in the slices 210.2 to 210.n to set up the residue DAC. It can be seen that if the capacitance of the capacitor array is effectively reduced from 40 pF to 4 pF then the current drawn from the reference is correspondingly reduced. Thus the energy required for conversion is reduced.

Figure 14:
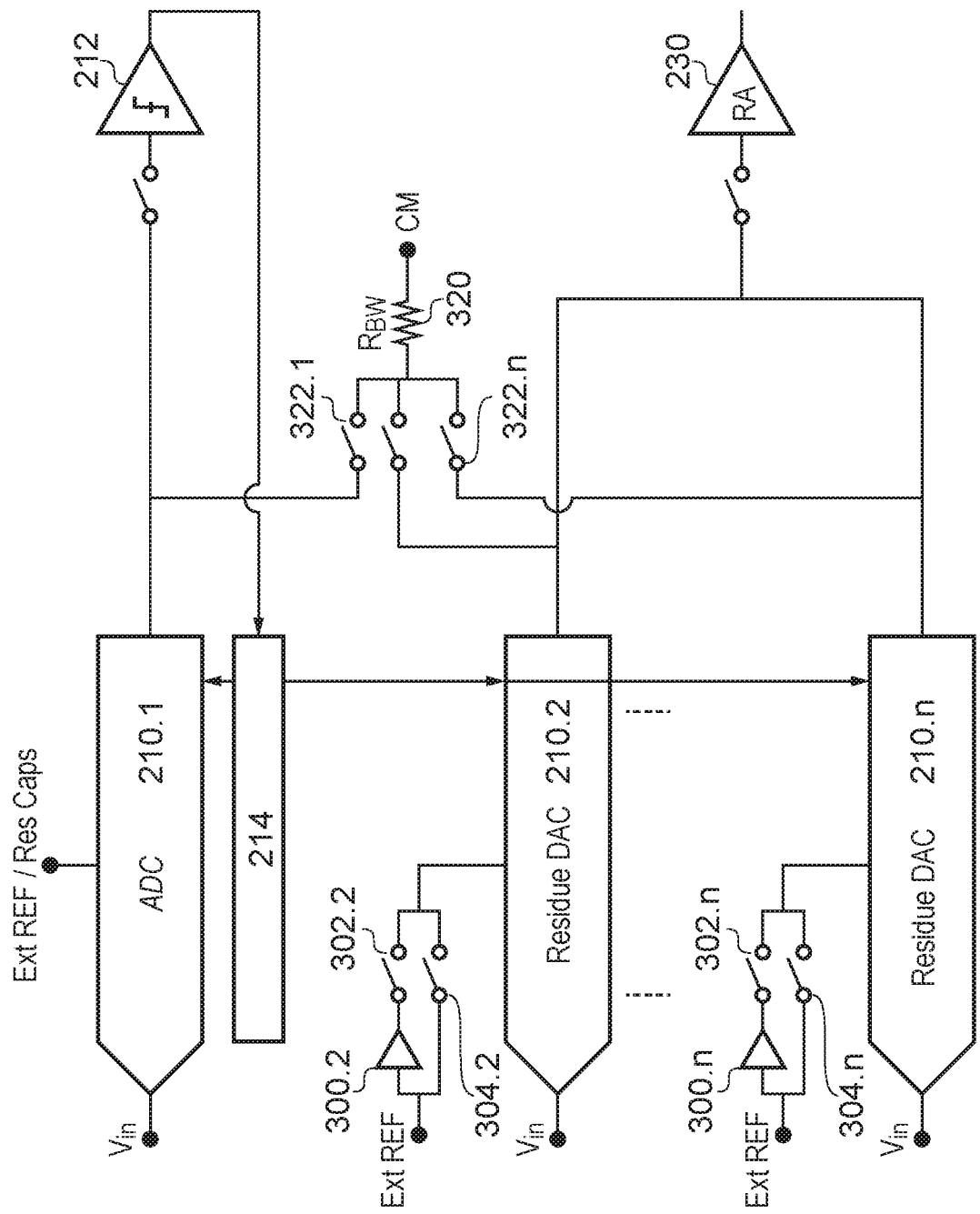
FIG. 14 is a circuit diagram of a further embodiment of the present disclosure showing the use of respective buffer amplifiers and a shared bandwidth limiting resistor.

If, for example, the sampling DACs 210.1 to 210.n were all built the same, and the residue DAC has 8 slices summing to 40 pF (for noise purposes) then each slice would have a capacitance of 5 pF. This 5 pF is split up between, say, 31 unit cells in a 5 bit example or 63 unit cells in a 6 bit example of a sampling DAC array. This gives a unit capacitor size of 161 fF in the 5 bit case or 79 fF in the 6 bit case. It can be seen that this approach allows the sliced ADC to achieve a high bandwidth as the RC value of each unit cell is very small even with a modest series resistance to swamp any transistor to transistor variation. Also as only one of the slices performs the bit trials the currents drawn from the current source are much reduced. This reduction of charge required to perform the bit trials also means that some resistance can be deliberately introduced into the charge path to reduce ringing within the supply voltage to the capacitors of the DAC FIG. 14 shows an arrangement where each of the slices 210.2 to 210.n of the residue DAC is connected to the external reference by way of a respective buffer 300.2 to 300.n which is selectively disconnectable from the slice 210.2 to 210.n by a series switch 302.2 to 302.n and where the slice 201.2 to 210.n can also be directly connected to the external reference by way of a further switch 304.2 to 304.n. Consequently the residue DAC slices 210.2 to 210.n can each be charged by way of the buffer for the majority of the set up time thereby reducing the current drawn from the external reference, and be connected to the external reference towards the end of the settling time such that they settle towards a correct voltage unaffected by offsets within their respective buffers. Furthermore each of the switched capacitor arrays can have their bandwidths limited by selected connection to a bandwidth limiting resistor 320 by way of respective switches 322.1 to 322.n.

Figure 15:
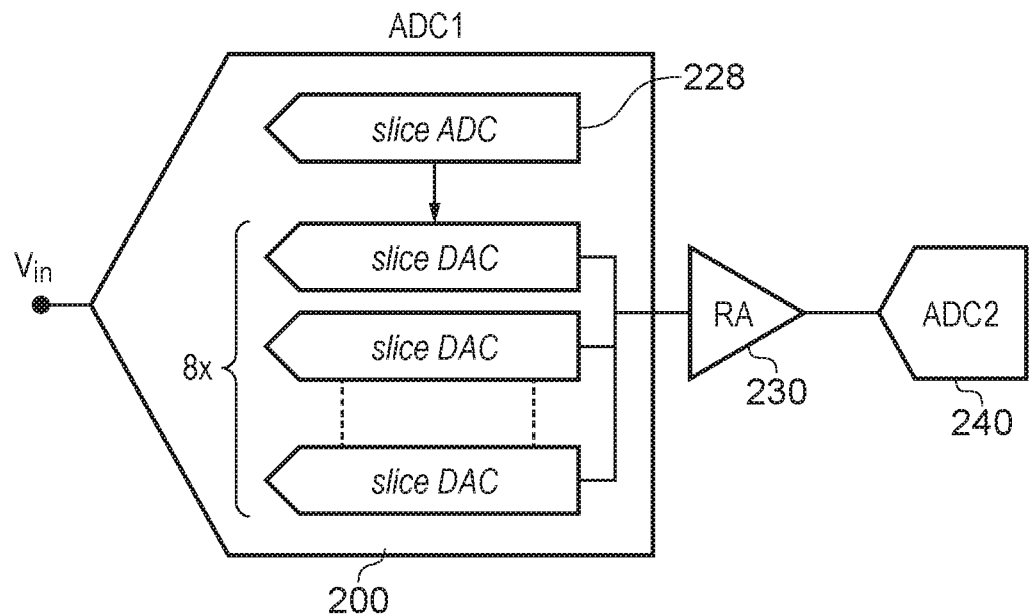
FIG. 15 is a schematic diagram of a two stage pipelined ADC in accordance with the teachings of this disclosure.

For completeness FIG. 15 schematically illustrates one embodiment of the present disclosure where a mini ADC 228, formed from one of the slices, works in association with eight other slices which form the residue DAC to drive the residue amplifier 230. In this embodiment the residue amplifier is connected to a further ADC 240. The first ADC, in this example, provides 6 or more bits of resolution whilst the second ADC 152 provides the remaining number of bits, for example 8 or more 9 bits of resolution to reach the desired overall resolution of the ADC.

In other examples each slice may present a capacitance of 3.2 pF, but the total digital to analog converter presented for the purposes of thermal noise amounts to 25.6 pF with the DACs operating in parallel.

It can be seen that the time to complete an SAR conversion can be expected to be longer than the time required to set up the individual DAC slices within the residue DAC. Furthermore, the output from the residue DAC is only really required after the SAR conversion from the first ADC is completed. This allows for the possibility of sharing a residue DAC between two or possibly more SAR slices. The SAR slices can be operated in a ping-pong manner such that one of them is about half way through its conversion when the other is sampling. Under such an arrangement the residue DAC has to sample at the same time as each of the SAR slices but immediately after it has finished sampling it can already be preset with at least half of the output word. The use of this approach is further enhanced by the use of a sub-ADC, such as a Flash ADC in order to get the first few bits of the bit trial performed rapidly or to reduce the signal swing during trials.

Figure 16:
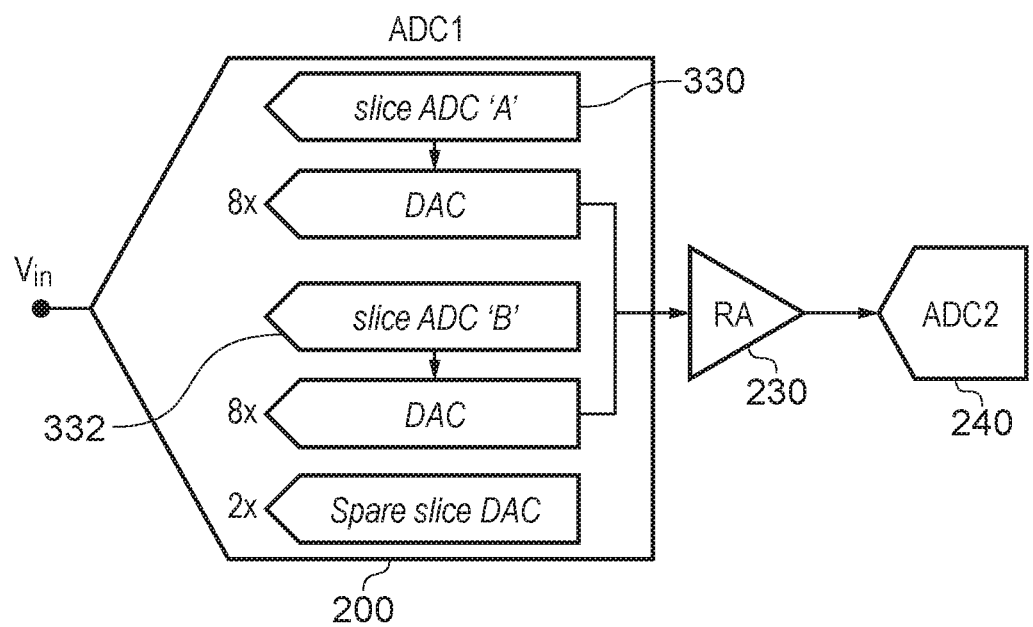
FIG. 16 is a schematic diagram of a two stage pipelined time interleaved ADC in accordance with the teachings of this disclosure.

FIG. 16 schematically illustrates an alternative embodiment of a pipelined architecture where two fast ADCs 330 and 332 are provided within ADC1 200, and each of the fast ADCs is associated with 8 DAC slices. The first ADC 200 is operated in a ping-pong interleaved manner and hence exceptionally minor mismatches might still result in the generation of additional sampling tones. In order to mitigate this one or more slices can be shuffled amongst the slices of each one of the residue DACs in order to reduce the risk of tones.

Figure 17:
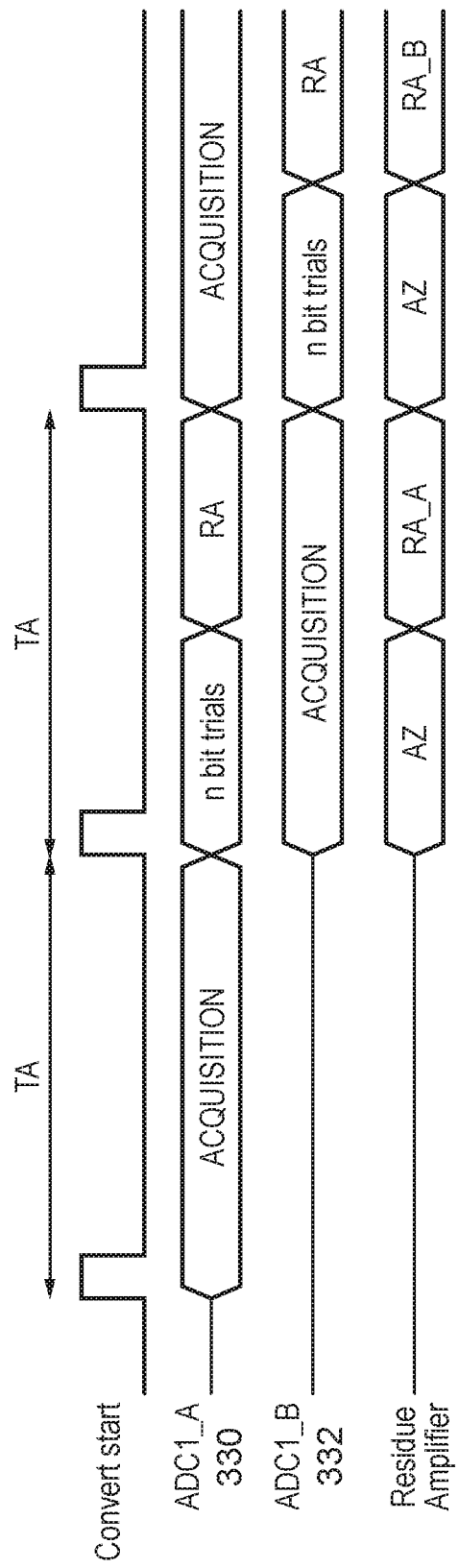
FIG. 17 is a timing diagram for the time interleaved ADC shown in FIG. 16.

FIG. 17 schematically shows a timing diagram for the arrangement in FIG. 16. As it can be seen each of the first ADCs designated "A" and "B" in FIGS. 16 and 17 operates out of phase with the other such that when ADC "A" 330 is performing its acquisition in a time period $T_A$ between successive "convert start" signals, the ADC "B" undertakes its bit trials and then passes its result to the residue amplifier. In each period $T_A$ the residue amplifier extends approximately half of its time amplifying the residue from one of the residue DACs associated with the respective slice ADCs "A" and "B", and the other half of its time undergoing auto-zeroing, AZ, in order to remove offset errors therefrom. The techniques and approaches use in auto-zeroing are well known to the person skilled in the art and need not be described here.

Although the description has focused on the DAC slices being in the form of switched capacitor arrays which can act as host to the sampling capacitor and the digital to analog converter concurrently, the teachings of the present invention can also be applied to circuit arrangements where the sampling arrangement and the DAC are separated, such as the arrangement shown in FIG. 3. Thus the circuit of FIG. 3 would be replicated several times to provide each sampling and DAC slice, but the size of the sampling capacitor would be reduced within each slice and each slice would include cross coupling switches to the other slices such that the capacitors would be connected in parallel in order to meet the required noise performance.

The number of stages in the pipeline can vary between two and the resolution of the converter. Put another way, each stage in the pipeline could be arranged to convert only one bit. The teachings of this disclosure would still be applicable to such a deeply pipelined arrangement as the time constant of each stage would be reduced by the multiple slices of a given stage which will act in parallel to provide the required noise performance. Thus the present disclosure is highly flexible and can be used in a vast number of configurations where DACs are required to interact with capacitor based sampling circuits.

The interleaving ratio can be 2× or more.

Figure 18:
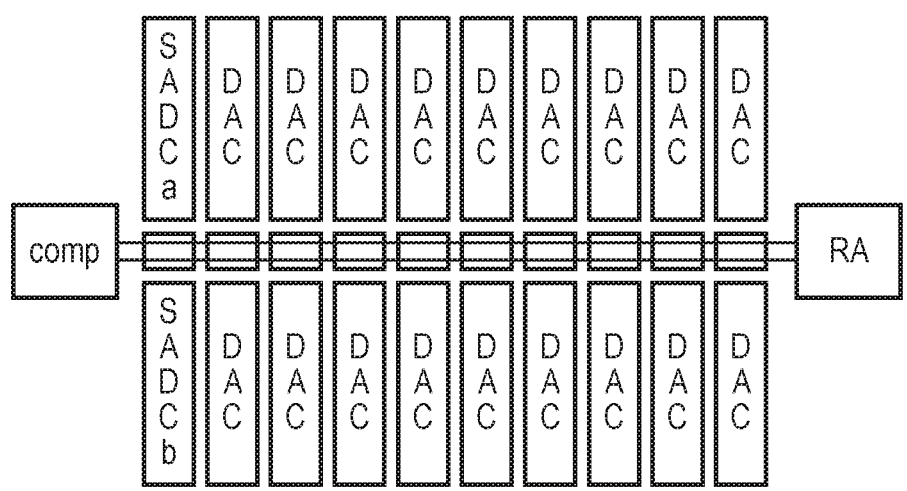
FIG. 18 is a plan view of a DAC layout floorplan on a semiconductor die.

FIG. 18 schematically illustrates an embodiment of a layout floorplan of the circuit shown in FIG. 16. The DAC slices are arranged in parallel between the comparator, comp, associated with the slice ADC, and the residue amplifier, RA, associated with this stage. One of the slices within each bank of switched capacitor DACs has, in this example, been allocated the role of being the slice ADC, SADC.

Figure 19:
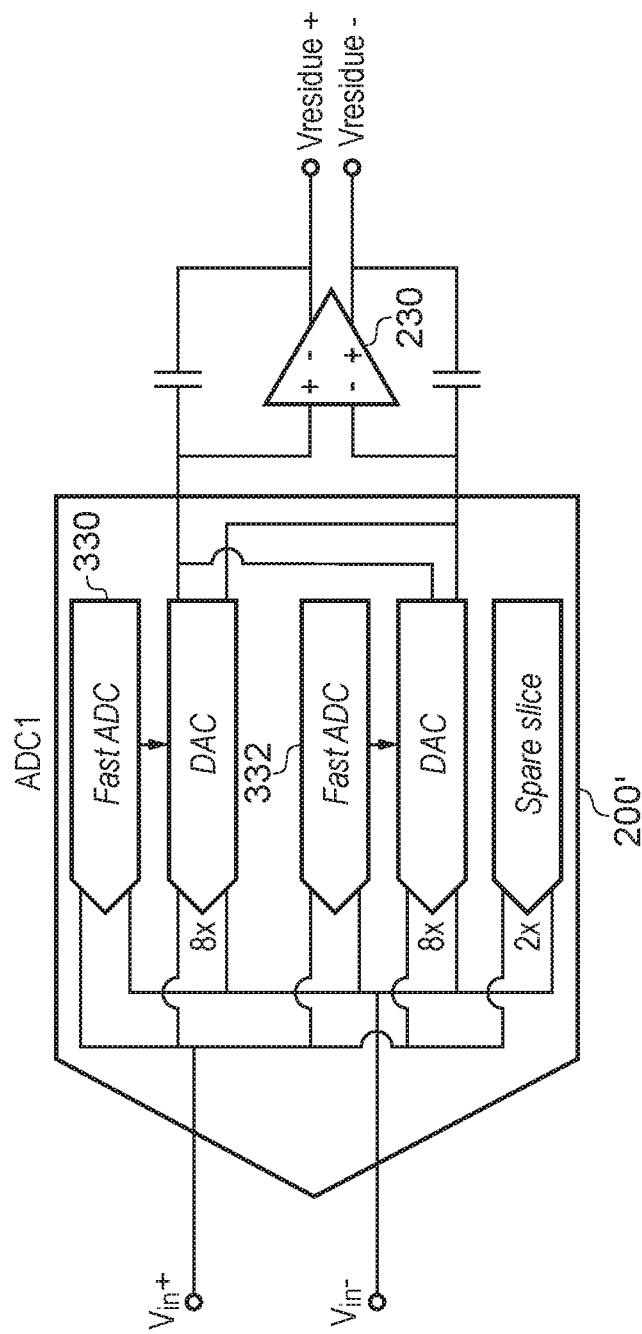
FIG. 19 is a schematic diagram of a dual ended (differential) ADC in accordance with the teachings of the present disclosure.

As noted earlier, all of these circuits can be implemented within a differential ADC arrangement 220' as shown in FIG. 19. Here capacitor arrays associated with the +ve and −ve inputs have each provide a residue signal to a differential residue amplifier 230.

It is generally desired that analog to digital converters can operate with reduced power consumption, for example due to their use within battery powered mobile equipment such as mobile telephones and the like. The desire to reduce power consumption has led to the adoption to deep submicron processors. This in turn has resulted in the adoption of decreasing power supply voltages in order to reduce the effects of leakage and power dissipation within increasing dense integrated circuits. It is now reasonably common for circuit designers to try and target supply voltages of around 1 to 1.3 volts. The adoption of these relatively low voltages makes the design of the residue amplifier 230 increasingly complex. The residue amplifier is typically provided as a differential input stage (long tail pair) configuration with a current source setting the tail current and active loads providing reasonably high gain. Given the speed of operation of the residue amplifier is also generally desirable to include a cascode stage. It can be seen that by the time the designer has to provide sufficient voltage headroom to operate the tail current generator, which is generally part of a current mirror, and the active loads and to provide voltage headroom to place the cascode stage within the circuit then the voltage swing that the actual amplifying transistors of the input stage can undergo is constrained to be very limited. This applies even if the use of techniques such as folded cascode stages are used to try and mitigate some of the headroom required. The limited headroom means that necessarily the voltage V residue applied to the residue amplifier 230 has to be well constrained and lie within a reduced dynamic range. This mitigates the use of either longer bit ranges within the first ADC converter stage such that the residue is correspondingly reduced, and/or reduced gain within the residue amplifier. The ability of the second stage ADC to change one or more of the digital codes presented to the slices of the residue DAC enables the residue to be adjusted to suite the operating range of the residue amplifier.

It is thus possible to use a plurality of sampling DACs to work together to produce an improved ADC without sacrificing noise performance.

The claims herein have been presented in single dependency format suitable for filing at the USPTO, however it is to be understood that for the purposes of those jurisdictions that allow multiply dependent claiming, each claim can depend on any preceding claim of the same type, unless that is clearly technically infeasible.

EXAMPLES

Example 1 is a stage of an analog to digital converter, comprising: an analog to digital converter coupled to an acquisition circuit having a first time constant; and a plurality of circuits, each comprising an acquisition circuit having substantially the same time constant as the first time constant and a digital to analog converter for receiving a respective control signal based on a digital output of the analog to digital converter and for forming a difference signal as a difference between a sampled voltage held by the acquisition circuit and the digital to analog converter output.

In Example 2, the stage according to Example 1, can optionally include, respective control signals to the digital to analog converters being variable.

In Example 3, the stage according to Example 1 or 2, can optionally include, at least two outputs of the plurality of circuits being combined.

In Example 4, the stage according to any one of Examples 1-3, can optionally include the acquisition circuits of the plurality of circuits being sampling capacitor digital to analog converters.

In Example 5, the stage according to any one of Examples 1-4, can optionally include, the analog to digital converter comprising a switched capacitor array forming a first sampling digital to analog converter.

In Example 6, the stage according to Example 5, can optionally include, each of the plurality of circuits comprising a switched capacitor array forming further sampling digital to analog converters, matched to the first sampling digital to analog converter.

In Example 7, the stage according to Example 6, can optionally include, the sampling digital to analog converters of the plurality of circuits being formed from a plurality of unit cells.

In Example 8, the stage according to any one of Examples 1-7, can optionally include, in at least one of the plurality of circuits the acquisition circuit being part of a first sampling digital to analog converter and is connected to a first sub-digital to analog converter.

In Example 9, the stage according to any one of Examples 1-8, can optionally include, a data manipulation block for receiving the digital output of the analog to digital converter and modifying the output to provide respective control words to the digital to analog converters in the plurality of circuits.

In Example 10, the stage according to any one of Examples 1-9, can optionally include, updates to a digital word supplied to one of the digital to analog converters of the plurality of circuits being offset in time from updates to another of the digital to analog converters of the plurality of circuits.

In Example 11, the stage according to any one of Examples 1-10, can optionally include, at least one spare circuit arranged to be swapped with other ones of the other circuits.

In Example 12, the stage according to any one of Examples 1-11, can optionally include, the analog to digital converter comprising a flash converter.

In Example 13, the stage according to any one of Examples 1-11, can optionally include, the analog to digital converter being a pipelined analog to digital converter comprising one or more of the stage according to claim 1.

Example 14 is an analog to digital converter using a plurality of slices having substantially matched sampling time constants operable together in response to an estimate of a digital word formed by an analog to digital converter comprising at least one but not all of the slices to form a residue having reduced thermal noise compared to a thermal noise of a single slice.

In Example 15, the analog to digital converter according to Example 14, can optionally include, the slices being formed of identical sampling digital to analog converters.

Example 16 is a digital to analog converter (DAC) comprising a plurality of substantially identical switched capacitor DAC stages where one stage is adapted to act as a master stage and at least two of the other stages are adapted to be connected in parallel to form a composite DAC output having reduced thermal noise compared to a thermal noise of any single slice.

In Example 17, the DAC according to Example 16 can optionally include, the DAC stages being sampling DACs operable to sample an input voltage and form an output as a function of the sampled input voltage and an average of digital words applied to the DAC stages.

Example 18 is a method of operating a plurality of matched digital to analog converter slices to form an analog to digital converter result and a residue, the method comprising: operating one of the matched digital to analog converter slices to perform an analog to digital conversion; and operating at least two of the matched digital to analog converter slices to perform a digital to analog conversion to form a difference between a sampled input and a digital approximation of the sampled input.

Example 19 is an analog to digital converter comprising: a plurality of sampling digital to analog converter slices, where for a first capacitor an area of a capacitor plate divided by a plate separation distance in a first slice differs from that of a corresponding capacitor in a second slice by a first ratio, a width to length ratio of a transistor switch associated with the first capacitor in the first slice differs from that of a corresponding transistor in the second slice by substantially the first ratio.

Example 20 is a plurality of sampling digital to analog converter (DAC) slices, where the sampling DAC slices comprise: a plurality of unit cells, each comprising a respective unit size capacitor and associated unit size transistor switches, and where pluralities of the unit cells are grouped together to form weighted capacitors within the sampling DAC slices, and where the sampling DAC slices are connected to a shared input node to sample an input signal in unison, and are connectable to a shared output node to form an average of their respective residues.

Example A is an apparatus comprising means for implementing/carrying out any one of the methods described herein.

Variations and Implementations

Note that the activities discussed above with reference to the Figures are applicable to any integrated circuits that involve processing analog signals and converting the analog signals into digital data using one or more ADCs. The features can be particularly beneficial to high speed ADCs, where input frequencies are relatively high, e.g., in the mega-Hertz to giga-Hertz range. The ADC can be applicable to medical systems, scientific instrumentation, wireless and wired communications systems (especially systems requiring a high sampling rate), radar, industrial process control, audio and video equipment, instrumentation, and other systems which uses ADCs. The level of performance offered by high speed ADCs can be particularly beneficial to products and systems in demanding markets such as high speed communications, medical imaging, synthetic aperture radar, digital beam-forming communication systems, broadband communication systems, high performance imaging, and advanced test/measurement systems (oscilloscopes).

The present disclosure encompasses apparatuses which can perform the various methods described herein. Such apparatuses can include circuitry illustrated by the Figures and described herein. Parts of various apparatuses can include electronic circuitry to perform the functions described herein. The circuitry can operate in analog domain, digital domain, or in a mixed-signal domain. In some cases, one or more parts of the apparatus can be provided by a processor specially configured for carrying out the functions described herein (e.g., control-related functions, timing-related functions). In some cases that processor can be an on-chip processor with the ADC. The processor may include one or more application specific components, or may include programmable logic gates which are configured to carry out the functions describe herein. In some instances, the processor may be configured to carrying out the functions described herein by executing one or more instructions stored on one or more non-transitory computer media.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims (if any) or examples described herein. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims (if any) or examples described herein. The description and drawings are, accordingly, to be regarded in an illustrative rather than in a restrictive sense.

Note that with the numerous examples provided herein, interaction may be described in terms of two, three, four, or more electrical components or parts. However, this has been done for purposes of clarity and example only. It should be appreciated that the system can be consolidated in any suitable manner. Along similar design alternatives, any of the illustrated components, modules, blocks, and elements of the Figures may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the Figures and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. It is also important to note that the functions described herein illustrate only some of the possible functions that may be executed by, or within, systems/circuits illustrated in the Figures. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure. Numerous other changes, substitutions, variations, alterations, and modifications may be ascertained to one skilled in the art and it is intended that the present disclosure encompass all such changes, substitutions, variations, alterations, and modifications as falling within the scope of the appended claims (if any) or examples described herein. Note that all optional features of the apparatus described above may also be implemented with respect to the method or process described herein and specifics in the examples may be used anywhere in one or more embodiments.

What is claimed is:

1. A capacitive digital to analog converter (DAC) arrangement for utilization within a data converter, comprising:
   a first DAC slice to receive a signal via an input line of the first DAC slice, the first DAC slice having a first resistance coupled in series on the input line of the first DAC slice; and
   a second DAC slice coupled in parallel with the first DAC slice, the second DAC slice to receive the signal via an input line of the second DAC slice, the second DAC slice having a second resistance coupled in series on the input line of the second DAC slice;
   wherein sampling performance of the first DAC slice matches sampling performance of the second DAC slice.

2. The capacitive DAC arrangement of claim 1, wherein;
   a first analog representation output by the first DAC slice is formed as a function of a first sampled input voltage sampled by the first DAC slice and a first digital word applied to the first DAC slice; and
   a second analog representation output by the second DAC slice is formed as a function of a second sampled input voltage sampled by the second DAC slice and a second digital word applied to the second DAC slice.

3. The capacitive DAC arrangement of claim 1, wherein;
   the first DAC slice has a first time constant;
   the second DAC slice has a second time constant; and
   the second time constant is within a threshold value of the first time constant.

4. The capacitive DAC arrangement of claim 1, wherein:
the first DAC slice includes a first capacitor and a first transistor;
the second DAC slice includes a second capacitor and a second transistor; and
a ratio of an area of the first capacitor and an area of the second capacitor is the same as a ratio of a width to length ratio of the first transistor and a width to length ratio of the second transistor.

5. The capacitive DAC arrangement of claim 1, wherein:
the first DAC slice and the second DAC slice are to be coupled to an analog-to-digital converter (ADC) stage;
a data manipulation block is to be coupled between the ADC stage and the first DAC slice, and between the ADC stage and the second DAC slice; and
the data manipulation block is to individually set digital words for the first DAC slice and the second DAC slice.

6. The capacitive DAC arrangement of claim 1, wherein:
the first DAC slice includes:
  a first set of capacitors to perform sampling;
  a second set of capacitors to perform sampling; and
  a first coupling capacitor coupled between the first set of capacitors and the second set of capacitors; and
the second DAC slice includes:
  a third set of capacitors to perform sampling;
  a fourth set of capacitors to perform sampling; and
  a second coupling capacitor coupled between the third set of capacitors and the fourth set of capacitors.

7. The capacitive DAC arrangement of claim 1, wherein:
a reference line for the first DAC slice includes a first switch and a first buffer coupled in parallel with a second switch between the first DAC slice and a reference input of the first DAC slice;
the first switch is to couple the first DAC slice to the first buffer and the second switch is to couple the first DAC slice directly to the reference input of the first DAC slice;
a reference line for the second DAC slice includes a third switch and a second buffer coupled in parallel with a fourth switch between the second DAC slice and a reference input of the second DAC slice; and
the third switch is to couple the second DAC slice to the second buffer and the fourth switch is to couple the second DAC slice directly to the reference input of the second DAC slice.

8. The capacitive DAC arrangement of claim 1, wherein the data converter is an analog to digital converter.

9. An analog to digital converter (ADC), comprising:
an ADC stage to receive an input signal and produce a digital representation of the input signal; and
a residue digital to analog converter (DAC), comprising:
  a first DAC slice coupled to the ADC stage, the first DAC slice to sample the input signal via a first line and the first DAC slice having a first resistance coupled in series with a first switch on the first line; and
  a second DAC slice coupled to the ADC stage in parallel with the first DAC slice, the second DAC slice to sample the input signal via a second line and the first DAC slice having a second resistance coupled in series with a second switch on the second line;
  wherein the first DAC slice and the second DAC slice are to form a residue representing a difference between the input signal and a voltage produced by the residue DAC when driven with the digital representation of the input signal from the ADC stage.

10. The ADC of claim 9, further comprising:
a buffer amplifier selectively connectable to the residue DAC to provide an internal reference signal generated by the buffer amplifier to the residue DAC during a first phase of operation of the ADC stage.

11. The ADC of claim 10, further comprising:
switching circuitry to provide an external reference signal generated by an external reference source to the residue DAC in place of the internal reference signal during a second phase of operation of the ADC stage.

12. The ADC of claim 9, wherein the ADC receives bit trials from a further ADC and uses the bit trials from the further ADC as a starting point for bit trials of the ADC.

13. The ADC of claim 9, wherein the first DAC slice, the first switch, the second DAC slice, and the second switch are controllable to operate in an interleaved manner.

14. The ADC of claim 9, wherein the first DAC slice, the first switch, the second DAC slice, and the second switch are controllable to operate in a parallel manner.

15. The ADC of claim 9, wherein sampling performance of the first DAC slice matches the sampling performance of the second DAC slice.

16. A digital to analog converter (DAC) slice for utilization in a data converter, comprising:
a capacitor coupled to an output of the DAC slice;
a set of transistors coupled to the capacitor, the set of transistors to operate as a switch to couple the capacitor to different lines of the DAC slice; and
a resistance coupled in series with a transistor of the set of transistors on an input line of the DAC slice;
wherein a size of the capacitor from a second capacitor in a second DAC slice by a first ratio, and a width to length ratio of the set of transistors differs from a further set of transistors in the further DAC slice by the first ratio.

17. The DAC slice of claim 16, wherein:
the capacitor and the set of transistors define a time constant of the DAC slice;
the DAC slice is to be coupled in parallel with the second DAC slice in the data converter; and
the time constant of the DAC slice is to be substantially matched with a time constant of the second DAC slice.

18. The DAC slice of claim 16, wherein width to length ratios of transistors within the set of transistors are substantially equal.

19. The DAC slice of claim 16, wherein:
the DAC slice is to be coupled to an analog-to-digital converter (ADC) stage of the data converter; and
the DAC slice is to be utilized in production of a residue related to the ADC stage.

20. The DAC slice of claim 16, wherein:
the DAC slice is to be coupled in parallel with further DAC slices in the data converter; and
sampling performance of the DAC slice matches sampling performance of the further DAC slices.

21. A digital to analog converter (DAC) slice for utilization in a data converter, comprising:
a capacitor coupled to an output of the DAC slice;
a set of transistors coupled to the capacitor, the set of transistors to operate as a switch to couple the capacitor to different lines of the DAC slice; and
the DAC slice is grouped together with further DAC slices to form weighted capacitors; and
each one of the DAC slice and further DAC slices comprises a capacitor and a set of transistors of a unit size.

22. The DAC slice of claim 21, wherein:
the DAC slice and further DAC slices are connected to a shared input node to sample an input signal in unison.

23. The DAC slice of claim 21, wherein:
the DAC slice and further DAC slices are operable to generate respective residues; and
the DAC slice and the further DAC slices are connectable to a shared output node to form an average of the respective residues.

\* \* \* \* \*